US007523430B1

(12) United States Patent
Patel

(10) Patent No.: US 7,523,430 B1
(45) Date of Patent: Apr. 21, 2009

(54) PROGRAMMABLE LOGIC DEVICE DESIGN TOOL WITH SIMULTANEOUS SWITCHING NOISE AWARENESS

(75) Inventor: Kamal Patel, Campbell, CA (US)

(73) Assignee: Altera Corporation, San Jose, CA (US)

( * ) Notice: Subject to any disclaimer, the term of this patent is extended or adjusted under 35 U.S.C. 154(b) by 307 days.

(21) Appl. No.: 11/222,588

(22) Filed: Sep. 9, 2005

(51) Int. Cl.
*G06F 17/50* (2006.01)

(52) U.S. Cl. .............................. 716/10; 716/9; 716/16; 716/17

(58) Field of Classification Search .................. 716/10, 716/9, 16, 17, 1
See application file for complete search history.

(56) References Cited

U.S. PATENT DOCUMENTS

| 5,843,813 | A | * | 12/1998 | Wei et al. ..................... 438/200 |
| 5,874,833 | A | * | 2/1999 | Perry et al. .................... 326/26 |
| 5,898,321 | A | * | 4/1999 | Ilkbahar et al. ............... 326/87 |
| 5,974,259 | A | * | 10/1999 | Casal et al. ................. 713/300 |
| 6,000,050 | A | * | 12/1999 | Komoda et al. ............. 714/724 |
| 6,392,437 | B2 | * | 5/2002 | El-Ayat ......................... 326/39 |
| 6,662,352 | B2 | * | 12/2003 | Nsame et al. ................. 716/14 |
| 6,714,050 | B2 | * | 3/2004 | McClintock et al. .......... 326/83 |

OTHER PUBLICATIONS

Vaidyanath et al.,"Influence Parameter Distribution on Simultaneous Switching Moise (SSN) for CMOS Output Drivers", 1994, IEEE Technical paper, pp. 33-38.*
Espana et al.,"Delta-I Noise Estimation Method for CMOS Combinational Circuits", May 13, 2001, 5th IEEE Workshop on Signal Propagation on Interconnections, presentation slides, 1 set—18 pages.*

Oruganti, "Selecting the FPGA that Meets Your Signal Integrity Requirement", May 17, 2005, Joural on FPGA and Programmable Logic, technical paper, pp. 1-6.*
Park et al.,"Co-Modeling and Co-Simulation of Package and On-Chip Decoupling Capacitor for Resonant Free Power/Ground Network Design", May 31, 2005, IEEE 55th Electronic Components and Technology Conference, Proceedings, pp. 727-731.*
"Basic Principles of Signal Integrity", Whitepaper of Altera Corporation, Jul. 2004, pp. 1-5.
"Xilinx Ships ISE 6.3i Design Suite", Press release of Xilinx, Inc., Printed from Internet Jun. 30, 2005.
"Simultaneous Switching Noise and Signal Integrity", Application note of Actel Corporation, Jul. 2003, pp. 1-5.
"Managing Ground Bounce in Large FPGAs", by Tony Duong, Application note of Xilinx, Inc., Dec. 8, 2004, pp. 1-5.
"High-Speed Board Layout Guidelines", Application note 224 of Altera Corporation, Sep. 2003, pp. 1-34.
"Guidelines for Designing High-Speed FPGA PCBs", Application note of Altera Corporation, Feb. 2004, pp. 1-72.

* cited by examiner

*Primary Examiner*—Sun J Lin
(74) *Attorney, Agent, or Firm*—Treyz Law Group; G. Victor Treyz; David C. Kellogg

(57) ABSTRACT

A logic design system is provided for designing programmable logic device integrated circuits with minimized simultaneous switching noise. The logic design system identifies input-output drivers that are associated with simultaneous switching noise groups by examining a netlist for a circuit design for a programmable logic device. Simultaneous switching noise is minimized by making adjustments to programmable operating parameters for the input-output drivers. The logic design system may make adjustments such as adjustments to programmable drive strengths, programmable slew rates, and programmable on-chip termination resistances. During place and route operations, the logic design system makes placement decisions that help to minimize simultaneous switching noise.

20 Claims, 17 Drawing Sheets

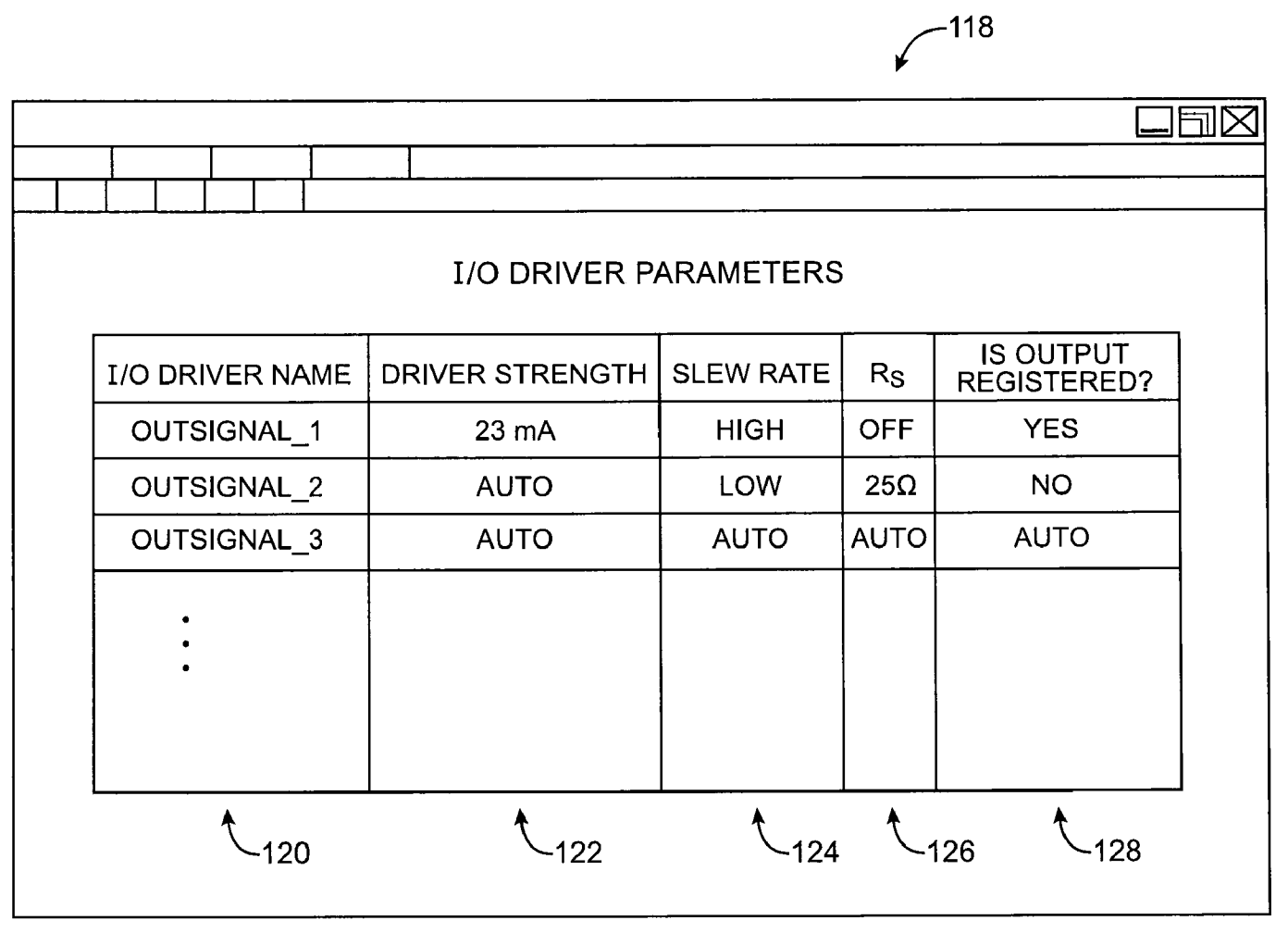

I/O DRIVER PARAMETERS

| I/O DRIVER NAME | DRIVER STRENGTH | SLEW RATE | Rs | IS OUTPUT REGISTERED? |
|---|---|---|---|---|
| OUTSIGNAL_1 | 23 mA | HIGH | OFF | YES |
| OUTSIGNAL_2 | AUTO | LOW | 25Ω | NO |
| OUTSIGNAL_3 | AUTO | AUTO | AUTO | AUTO |
| ... | | | | |

FIG. 10

USER SETTINGS FOR AUTOMATIC SSN
OPTIMIZATION OF I/O PARAMETERS AND PLACEMENT

- 178 — ☑ ALLOW AUTO SSO GROUP IDENTIFICATION
- 180 — ☑ ALLOW AUTO SELECTION OF I/O PARAMETERS TO REDUCE SSN EFFECTS
- 182 — ☐ ALLOW AUTO SELECTION OF PROGRAMMABLE DRIVE STRENGTH
- 184 — ☑ ALLOW AUTO SELECTION OF PROGRAMMABLE SLEW RATE
- 186 — ☐ ALLOW AUTO SELECTION OF OCT RESISTANCE
- 188 — ☑ ALLOW AUTO PLACEMENT OF I/O REGISTERS AND OTHER RESOURCES TO MINIMIZE SSN EFFECTS
- 190 — ☑ FAVOR HIGH CAPACITANCE LOAD LOCATIONS FOR SSI AND SSO GROUPS
- 192 — ☐ FAVOR PROXIMITY TO POWER PINS FOR SSI AND SSO GROUPS
- 194 — ☐ IMPROVE I/O-TO-POWER RATIO IN BANKS CONTAINING SSI AND SSO GROUPS
- 196 — ☐ INSERT PROGRAMMABLE GROUND AND $V_{CC}$ PINS IN PROXIMITY OF SSI AND SSO GROUPS
- 198 — ☐ SELECTIVELY LOCATE REGISTERS IN CORE FOR SSO GROUPS
- 200 — ☐ AUTO PLACEMENT OF HIGH SLEW PINS
- 202 — ☐ AUTO PLACEMENT OF SSI AND SSO GROUPS RELATIVE TO CLOCK AND ASYNCH PINS

FIG. 22 ations.

PROGRAMMABLE LOGIC DEVICE DESIGN TOOL WITH SIMULTANEOUS SWITCHING NOISE AWARENESS

BACKGROUND

This invention relates to programmable logic device integrated circuits, and more particularly, to computer aided design (CAD) tools for designing logic circuits in programmable logic devices.

Programmable logic devices are a type of integrated circuit that can be programmed by a user to implement a desired custom logic function. In a typical scenario, a logic designer uses computer-aided design (CAD) tools to design a custom logic circuit. These tools use information on the hardware capabilities of a given programmable logic device to help the designer implement the custom logic circuit using the resources available on that given programmable logic device. When the design process is complete, the CAD tools generate configuration data files. The configuration data is loaded into programmable logic devices to configure them to perform the desired custom logic function.

Conventional logic design tools provide logic designers with information on how well a given implementation of a custom logic design is expected to perform. Experienced designers can make adjustments to the design to improve performance. For example, if a designer is informed that a particular implementation of a custom circuit is consuming a large amount of power, the designer may use the logic design tools to make changes to the design that reduce power consumption.

At high switching speeds, designers must take into account noise effects that would otherwise be negligible. An important noise effect to consider is so-called simultaneous switching noise. Simultaneous switching noise (SSN) affects circuits when a number of input or output drivers switch simultaneously. When a significant number of drivers switch simultaneously, the value of the ground voltage can rise and the value of the positive power supply voltage can drop. These SSN effects, which are referred to as ground bounce and Vcc sag, may be significant enough that the digital data passing through the drivers is corrupted.

It would therefore be desirable to provide logic design tools that help logic designers avoid the deleterious effects of simultaneous switching noise when designing custom circuits for programmable logic devices.

SUMMARY

A logic design system is provided for designing circuits for programmable logic devices with minimized simultaneous switching noise. The logic design system uses computer-aided design tools to obtain a custom circuit design from a logic designer. The logic design system processes the design to produce an implementation of the custom circuit design in a given programmable logic device integrated circuit architecture. The logic design system produces configuration data files based on the custom circuit design. When the configuration data is loaded into a given programmable logic device, the programmable logic device is configured to implement the custom circuit design.

The logic design system optimizes the way in which the circuit design is implemented in the programmable logic device. Signals that switch simultaneously may lead to problems with circuit performance due to simultaneous switching noise (SSN) effects. When processing the custom circuit design, the logic design system can examine a netlist description of the circuit design to determine which input-output drivers are controlled by common output enables. If a set of output drivers is controlled by the same output enable signal, the logic design system can conclude that these output drivers will switch simultaneously. Drivers that switch simultaneously contribute to simultaneous switching noise.

By automatically identifying which input-output drivers are controlled by common output enable signals and by accepting manual input from a logic designer, the logic design system categorizes certain input-output drivers in the circuit design as belonging to SSN groups.

The input-output drivers on a programmable logic device may have programmable operating parameters such as programmable drive strengths, programmable slew rates, and programmable on-chip termination resistances. These parameters may be adjusted by creating and loading appropriate configuration data into the programmable logic device.

The logic design system preferably minimizes the effects of simultaneous switching noise by adjusting the programmable operating parameters of appropriate input-output drivers. For example, if an input-output driver in an identified SSN group does not require a high drive current, the logic design system can program the driver to operate at a low drive current setting by creating appropriate configuration data. Drivers that do not require high slew rates can be programmed to operate at lower slew rates, which also tends to reduce simultaneous switching noise. Noise due to signal reflections can be reduced by using the logic design system to automatically select an appropriate on-chip termination resistance for each driver.

As part of the process of converting the desired custom circuit design from a circuit designer into a set of configuration data for programming a programmable logic device, the logic design system performs place and route operations. During place and route operations, the logic design system can make placement decisions that help reduce simultaneous switching noise in the programmable logic device while satisfying design constraints.

For example, the logic design system can place input-output drivers in the SSN groups in high capacitance locations on the programmable logic device. Locating SSN groups in high capacitance areas of the device helps to minimize SSN noise through increased capacitive loading effects. SSN groups may be placed close to power pins to reduce loop inductances. The total number of SSN drivers that are associated with a given set of power pins can be limited to ensure that a maximum ratio between SSN drivers and power pins is not exceeded. The logic design system may also insert power pins into an input-output circuit block among SSN drivers to help reduce the I/O to power pin ratio. The inserted power pins, which are sometimes referred to as soft power and ground pins, are output pins that have been configured to drive ground (e.g., 0 volt) and positive power supply (e.g., Vcc) signals at a high drive-strength. The logic design system may also minimize the number of high slew input-output drivers that are placed in a given input-output circuit region. The logic design system can selectively move registers from the input-output circuitry at the periphery of the device to core logic. SSN groups of input-output drivers may be moved away from clock pins and other asynchronous pins such as clears and loads.

Further features of the invention, its nature and various advantages will be more apparent from the accompanying drawings and the following detailed description of the preferred embodiments.

BRIEF DESCRIPTION OF THE DRAWINGS

FIG. 10 is an illustrative logic design tool screen that may be used to adjust I/O driver parameters to minimize SSN noise in accordance with the present invention.

FIG. 22 is an illustrative settings screen that a logic design tool can provide to a user to allow adjustment of SSN reduction settings for the tool in accordance with the present invention.

DETAILED DESCRIPTION

Figure 1:
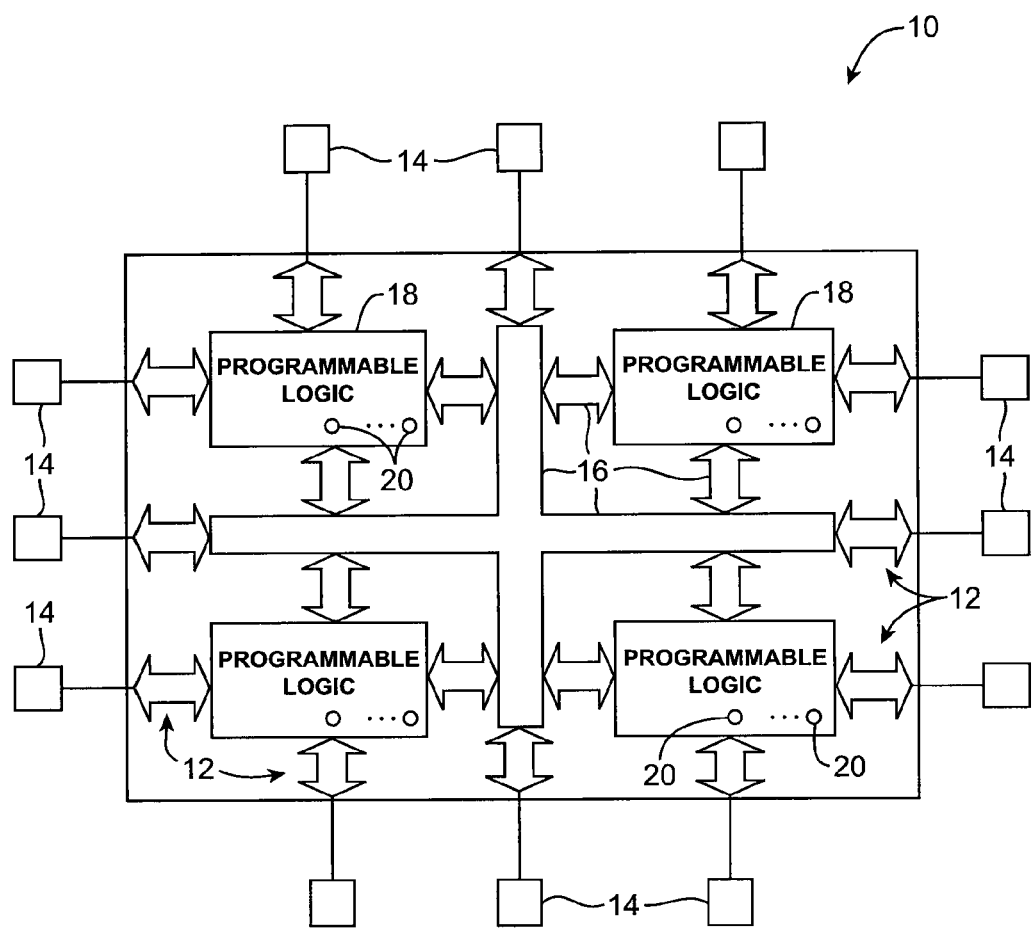
FIG. 1 is a diagram of an illustrative programmable logic device in accordance with the present invention.

The present invention relates to the design of integrated circuits such as programmable logic device integrated circuits. The invention also relates to design tools used to design such circuits and the methods for running these tools.

Programmable logic devices are integrated circuits that can be configured by a user to perform custom logic functions. Programmable logic devices are configured ("programmed") by loading configuration data into the device. The configuration data selectively turns on and off components of the device's circuitry and thereby customizes the logic on the device. Programmable logic devices with non-volatile configuration memory retain their configuration data when power is removed. Programmable logic devices with volatile configuration data are typically loaded with configuration data on system power-up using an ancillary circuit called a configuration device. The configuration device may store the configuration data using non-volatile memory. Programmable logic devices with non-volatile memory can also be configured after installation in a system (so-called in-system programming).

The present invention may be used in the context of any integrated circuit that has circuitry that can be configured by a user to perform a custom function, but is described in the context of programmable logic devices for clarity.

If the noise on a signal path in a programmable logic device is too high, the data on that path may be corrupted. Noise effects must therefore be taken into account when designing programmable logic devices, particularly when high speed signals are involved.

One important noise effect that should be considered when designing programmable logic devices is simultaneous switching noise. This type of noise occurs when many input-output (I/O) drivers are switched simultaneously. The simultaneous switching of the drivers induces changes in the power supply voltages on the device. In particular the ground voltage rises ("bounces") and the positive power supply voltage falls ("sags"). The magnitude of simultaneous switching noise effects for a set of simultaneously switched signals can be estimated using equation 1.

$$V = N*L*di/dt \qquad (1)$$

In equation 1, the value of V represents the magnitude of the induced voltage change due to simultaneous switching noise. The value of V scales with the number of simultaneously switched signals N. If more signals are switched simultaneously, N will be high and the effects of SSN will be high. If fewer signals are switched simultaneously, SSN effects will be reduced. The parameter L represents the lumped inductance of the integrated circuit die and its environment (i.e., die, solder ball bumps, package, board components, etc.). High inductance exacerbates SSN. If L is reduced, SSN effects will be reduced. The parameter di/dt represents the rate of change of the signal current. If a signal changes rapidly, SSN effects will be increased. SSN effects will be low if a signal has a low slew rate.

Logic design tools in accordance with the present invention make adjustments to I/O driver parameters and make placement decisions during place and route operations that minimize SSN effects by reducing N, L, and di/dt.

An illustrative programmable logic device 10 of the type that may be configured to perform the functions of a custom logic circuit designed by a logic design tool in accordance with the present invention is shown in FIG. 1.

Programmable logic device 10 may have input-output circuitry 12 for driving signals off of device 10 and for receiving signals from other devices via input-output pins 14. Pins 14 may be any suitable types of pins or solder bumps for making electrical connections between the internal circuitry of device 10 and external packaging. Some of the pins 14 may be used for high-speed communications signals. Other pins may be used to provide power supply voltages to the device 10 or may be used for DC or low-frequency signals.

Interconnection resources 16 such as global and local vertical and horizontal conductive lines and busses may be used to route signals on device 10. The remainder of the circuitry 18 on device 10 includes blocks of programmable logic, memory blocks, regions of digital signal processing circuitry, processors, hardwired circuits for supporting complex communications and arithmetic functions, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Some of the logic of programmable logic device 10 is fixed (hardwired). The programmable logic in device 10 includes components that may be configured so that device 10 performs a desired custom logic function. The programmable logic in programmable logic device 10 may be based on any suitable programmable technology. With one suitable approach, configuration data (also called programming data) may be loaded into programmable elements in the programmable logic device 10 using pins 14 and input/output circuitry 12. During normal operation of device 10, the programmable elements (also sometimes called configuration bits or configuration memory) each provide a static control output signal that controls the state of an associated logic component in the programmable logic of circuitry 18.

In a typical volatile arrangement, the programmable elements may be random-access memory (RAM) cells that are loaded from an external configuration device integrated circuit via certain pins 14 and appropriate portions of input/output circuitry 12. The loaded RAM cells provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Circuit elements in input/output circuitry 12 and interconnection resources 16 are also generally configured by the RAM cell outputs as part of the programming process (e.g., to customize I/O and routing functions). The circuit elements that are configured in input/output circuitry 12, interconnection resources 16, and circuitry 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from electrically-configured fuses or electrically-configured antifuses, programmable logic devices in which elements 20 are formed from electrically-programmable read-only-memory (EPROM) or erasable-electrically-programmable read-only-memory (EEPROM) technology, programmable logic devices with programmable elements made from magnetic storage elements, programmable logic devices with programmable elements made from phase-change materials, mask-programmed devices, etc. Illustrative programmable logic elements are shown schematically as elements 20 in FIG. 1.

The configuration memory of device 10 is preferably provided with configuration data from a user (e.g., a logic designer). Once provided with appropriate configuration data, the configuration memory will selectively control (e.g., turn on and off) portions of the circuitry in the programmable logic device 10 and thereby customize its functions so that it will operate as desired.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources 16 such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency. As an example, hardwired wireless circuitry may be used to receive wirelessly-transmitted configuration data. Other hardwired communications circuitry and digital signal processing circuitry (e.g., multipliers, adders, etc.) may also be used.

Figure 2:
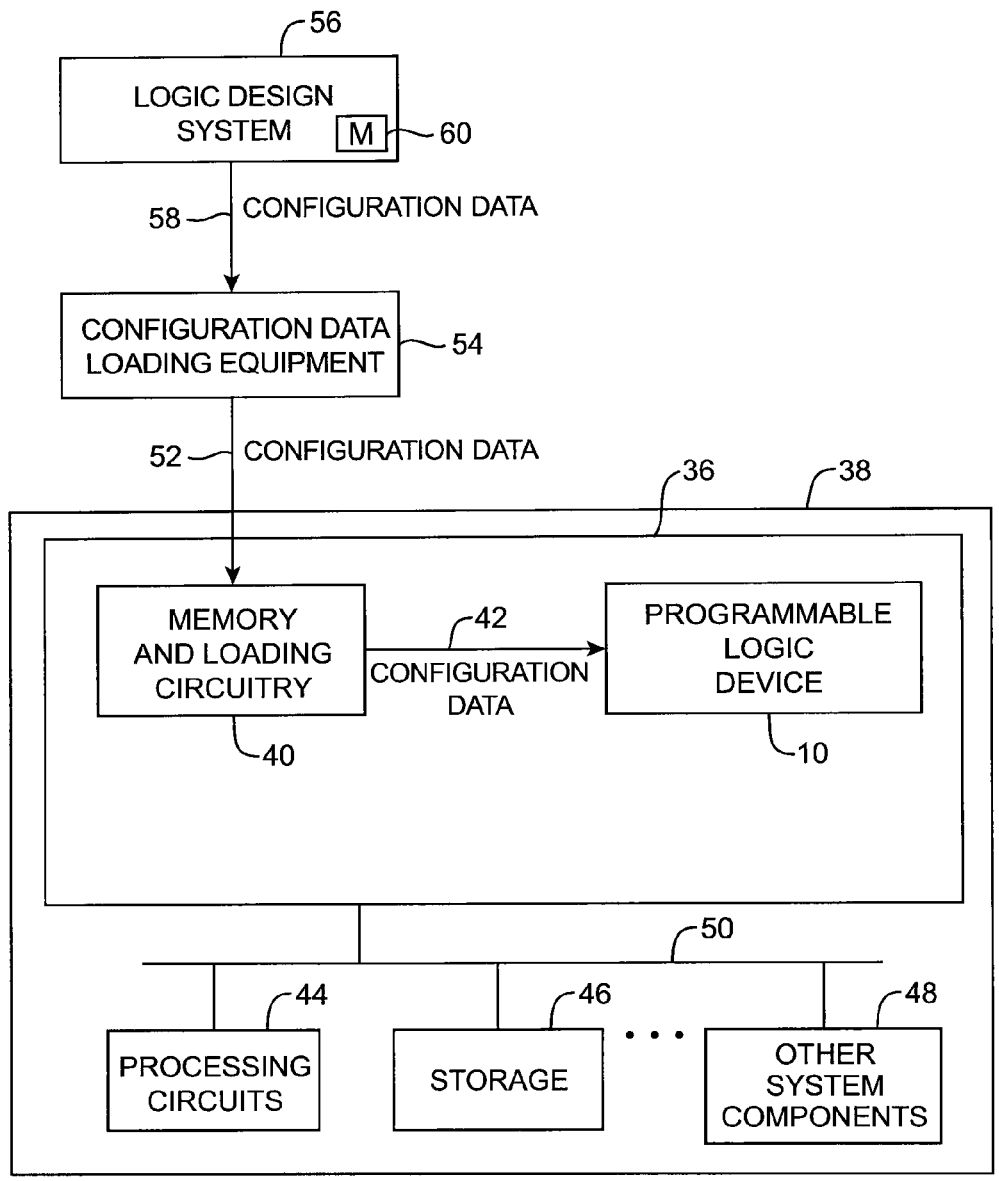
FIG. 2 is a diagram showing how programmable logic device configuration data is created by a logic design system and loaded into a programmable logic device to configure the device for operation in a system in accordance with the present invention.

An illustrative system environment in which a custom logic circuit may be designed and implemented in a programmable logic device is shown in FIG. 2. As shown in FIG. 2, a programmable logic device 10 may be mounted on a board 36 in a system 38. In general, programmable logic device 10 may receive programming data from any suitable equipment or device. In the example of FIG. 2, programmable logic device 10 is the type of programmable logic device that receives configuration data from associated memory and loading circuitry 40 (sometimes called a "configuration device"). With this type of arrangement, a memory chip and separate loading chip or an integrated memory and loading chip may, if desired, be mounted on the same board 36 as programmable logic device 10. The configuration device 40 may, for example, include erasable-programmable read-only memory (EPROM) circuitry for storing configuration data and programmable logic device configuration data loading circuitry for loading the data into device 10. When system 38 boots up (or at another suitable time), the configuration data for configuring the programmable logic device may be supplied to programmable logic device 10 from configuration device 40, as shown schematically by path 42. The configuration data that is supplied to the programmable logic device may be stored in the programmable logic device in configuration data cells (memory).

System 38 may include processing circuits 44, storage 46, and other system components 48. The components of system 38 may be located on one or more boards such as board 36 or other suitable mounting structures or housings and may be interconnected by busses and other electrical paths 50.

Device 40 may be supplied with the configuration data for device 10 over a path such as path 52. Device 40 may, for example, receive the configuration data from configuration data loading equipment 54 or other suitable equipment. Data loading may take place before or after circuitry 40 is installed in system 38.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device or for producing a custom mask for a mask-programmed chip.

As shown in FIG. 2, the configuration data produced by a logic design system 56 may be provided to equipment 54 over a path such as path 58. The equipment 54 can provide the configuration data to device 40, so that device 40 can later provide this configuration data to the programmable logic device 10 over path 42.

In arrangements of the type shown in FIG. 2, the programmable logic device 10 may have configuration data cells formed from memory cells such as static random-access memory cells. This is merely one illustrative arrangement for programming a programmable logic device 10. Any suitable arrangement for programming programmable logic device 10 may be used if desired. For example, programmable logic device 10 may be based on non-volatile configuration data cells such as erasable-programmable read-only memory (EPROM) cells. With this type of arrangement, device 10 can be configured by programming the configuration data into the EPROM cells on the device. Programmable logic device 10 may also be based on programmable elements such as fuses and antifuses or programmable elements based on other technologies (e.g., magnetic devices, mask programming, etc.). In a mask-programmed environment, the configuration data (or other such data) that is produced by the logic design system may be used to generate a mask set for programming device 10. For clarity, the present invention will generally be described in the context of programmable logic devices that are configured by the loading of configuration data produced by logic design system 56, rather than mask programming.

Logic circuit design system 56 includes processing circuitry and storage 60. In supporting design operations involved in implementing a desired custom logic function, the logic design system 56 uses software implemented using circuitry and storage 60 to make operating parameter adjustments and placement decisions that minimize SSN effects.

Figure 3:
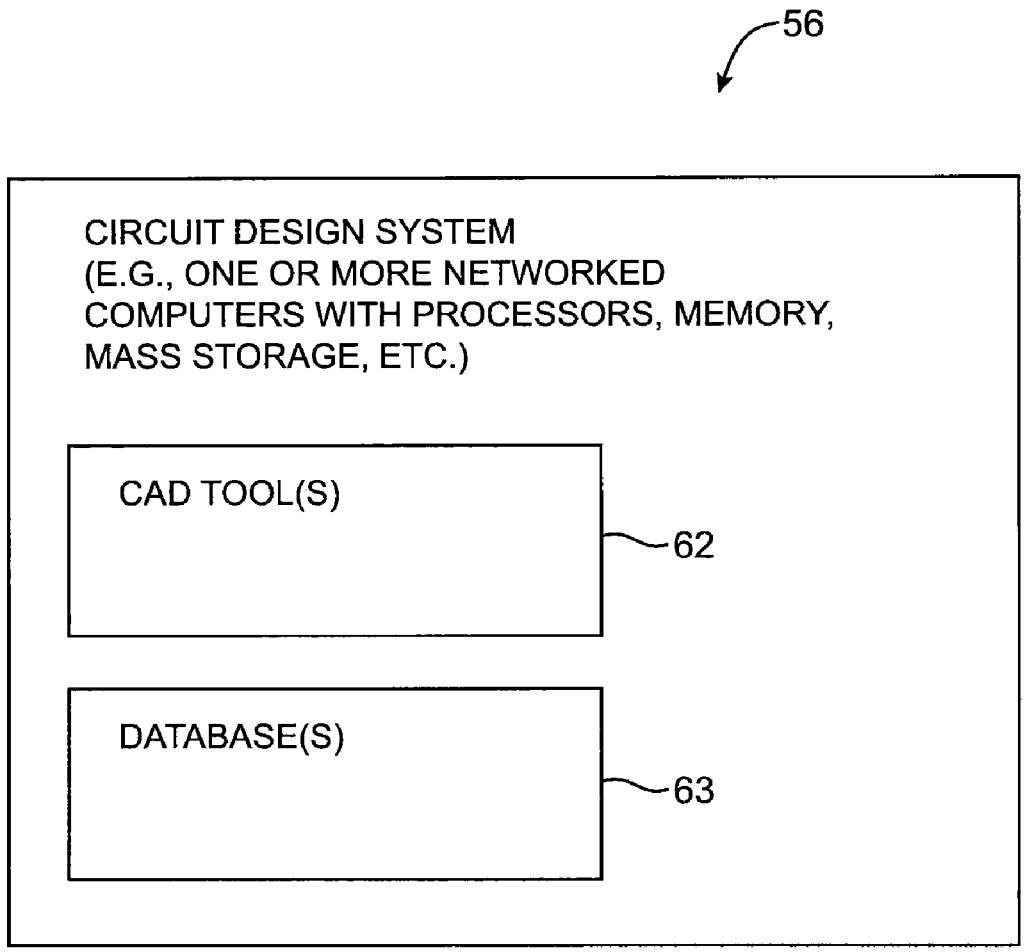
FIG. 3 is a diagram of a circuit design system that may be used to generate configuration data for implementing custom circuit designs in programmable logic devices in accordance with the present invention.

An illustrative circuit design system 56 in accordance with the present invention is shown in FIG. 3. System 56 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 62 and databases 63 reside on system 10. During operation, executable software such as computer aided design tool(s) 62 runs on the processor(s) of system 56. Databases 63 are used to store data for the operation of system 56. In general, software and data may be stored on any computer-readable medium (storage) in system 56. Such storage may include, for example, computer memory chips, removable and fixed media such as hard disk drives, flash memory, compact discs (CDs), DVDs, other optical media, and floppy diskettes, tapes, or any other suitable memory or storage device(s). When the software of system 56 is installed, the storage of system 56 has instructions and data that cause the computing equipment in system 56 to execute various methods (processes). When performing these processes, the computing equipment is configured to implement the functions of the circuit design system.

The computer aided design tool(s) 62 may be provided by a single vendor or multiple vendors. The tool 62 may be provided as one or more suites of tools (e.g., a compiler suite for performing tasks associated with implementing a circuit design in a programmable logic device) and/or as one or more separate software components (tools). Database(s) 63 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

When a logic designer uses tools 56 to implement a circuit, the logic designer is faced with a number of potentially challenging design decisions. The designer must balance factors such as cost, size, and performance to create a workable end product. Tradeoffs are involved. For example, a circuit of a given design can be implemented so that it operates quickly, but consumes a large amount of power and on-chip resources or can be implemented so that is operates more slowly, while consuming less power and fewer resources.

The present invention provides tools 62 that make I/O parameter adjustments and placement decisions that minimize SSN effects and thereby improve device performance. For clarity, the SSN minimization functions of the invention are generally described in the context of logic design system 56 and CAD tools 62 In general, any suitable number of software components (e.g., one or more tools) may be used to provide a circuit designer with SSN reduction assistance. These software components may be separate from logic compilers, place-and-route tools and other software in tools 62 or some or all of the software components that provide SSN reduction assistance functionality may be provided within logic synthesis and optimization tools, a place-and-route tool, etc.

Figure 4:
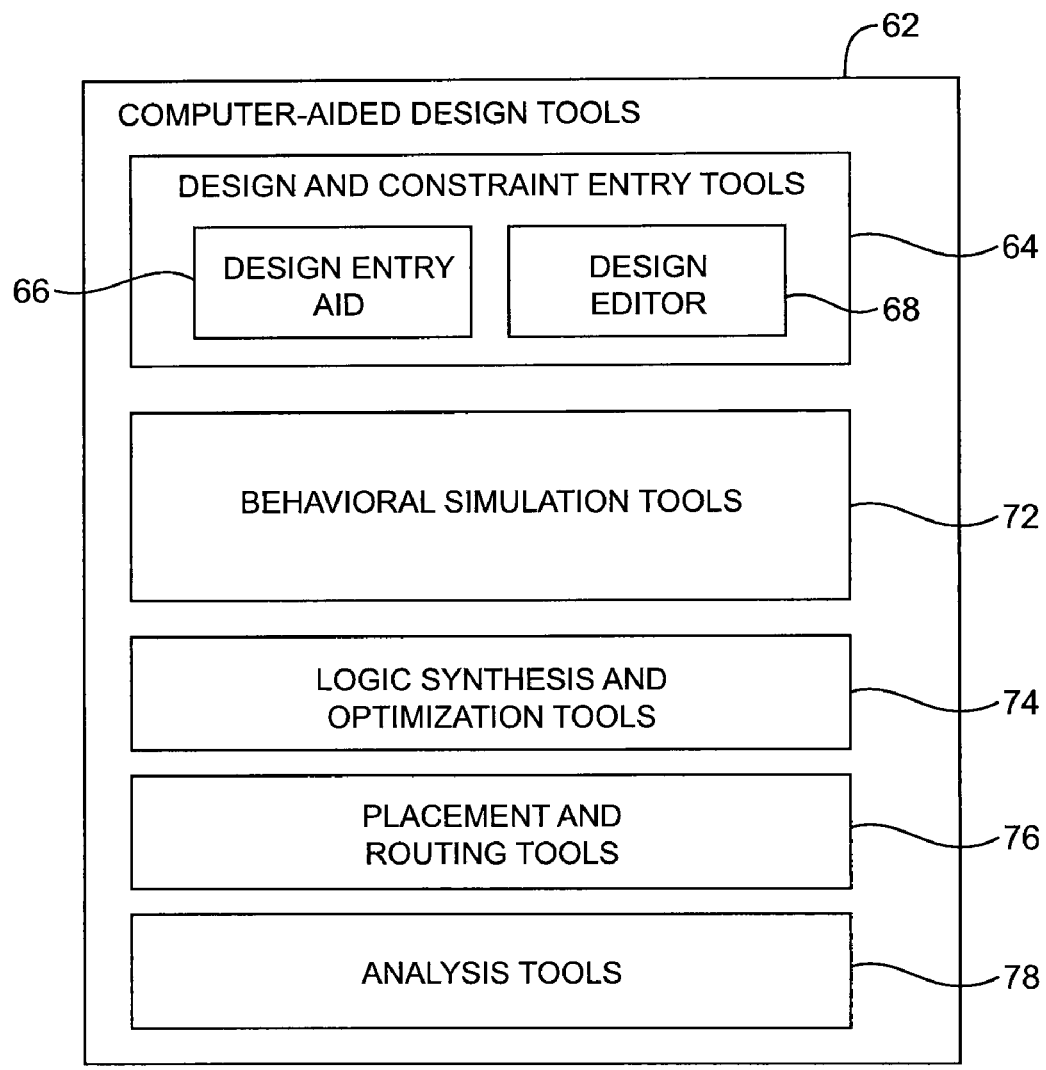
FIG. 4 is a diagram of illustrative computer-aided design (CAD) tools that may be used in a logic design system in accordance with the present invention.

An illustrative set of computer aided design tools 62 that may be used in a logic design system such as system 56 of FIGS. 2 and 3 are shown in FIG. 4.

The design process typically starts with the formulation of logic circuit functional specifications. A logic designer can specify how a desired circuit should function using design and constraint entry tools 64. Design and constraint entry tools 64 may include tools such as design and constraint entry aid 66 and design editor 68. Design and constraint entry aids such as aid 66 may be used to help a logic designer locate a desired design from a library of existing logic designs and may provide computer-aided assistance to the logic designer for entering (specifying) the desired design. As an example, design and constraint entry aid 66 may be used to present screens of options for a user. The user may click on the on-screen options to select whether the circuit being designed should have certain features. Design editor 68 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 64 may be used to allow a logic designer to provide a desired logic design to using any suitable format. For example, design and constraint entry tools 64 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 64 may allow the logic designer to provide a logic design to the logic design system 10 using a hardware description language such as Verilog hardware description language (HDL) or Very High Speed Integrated Circuit Hardware Description Language (VHDL). The designer of the logic circuit can enter the logic design by writing hardware description language code with editor 68. Blocks of code may be imported from user-maintained or commercial libraries if desired.

After the design has been entered using design and constraint entry tools 64, behavioral simulation tools 72 may be used to simulate the functional performance of the design. If the functional performance of the design is incomplete or incorrect, the logic designer can make changes to the design using design and constraint entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.)

Once the functional operation of the logic design has been determined to be satisfactory, logic synthesis and optimization tools 74 may be used to implement the logic design in a particular programmable logic device (i.e., in the logic and interconnect resources of a particular programmable logic device product or product family).

Tools 74 attempt to optimize the design by making appropriate selections of hardware to implement different logic functions in the logic design based on the logic design data and constraint data entered by the logic designer using tools 64.

After logic synthesis and optimization using tools 74, the logic design system may use tools such as placement and routing tools 76 to perform physical design steps (layout synthesis operations). Placement and routing tools 76 are used to determine how to place the circuits for each logic function within the programmable logic device. For example, if two counters interact with each other, the placement and routing tools 76 may locate these counters in adjacent logic regions on the programmable logic device to minimize interconnect delays. The placement and routing tools 76 create orderly and efficient implementations of logic designs for a given programmable logic device.

Tools such as tools 74 and 76 may be part of a compiler suite (e.g., part of a suite of compiler tools provided by a programmable logic device vendor). In accordance with the present invention, tools such as tools 74 and 76 are used to manually and automatically take into account the effects of SSN in implementing a desired circuit design in a programmable logic device.

After an implementation of the desired logic design in the programmable logic device has been generated using placement and routing tools 76, the implementation of the design may be analyzed and tested using analysis tools 78. After satisfactory optimization operations have been completed using tools 62, tools 62 can produce the configuration data for the programmable logic device or can generate other suitable output data (e.g., the specifications for a lithographic mask set for fabricating an integrated circuit incorporating the logic design). Depending on the type of programmable logic device being used (e.g., a device based on non-volatile memory, a device based on volatile memory, a device based on fuses or antifuses, etc.), configuration data may be programmed into the programmable logic device directly or may be provided to a memory device that later (e.g., upon power-up) loads the configuration data into the programmable logic device to program the device.

Figure 5:
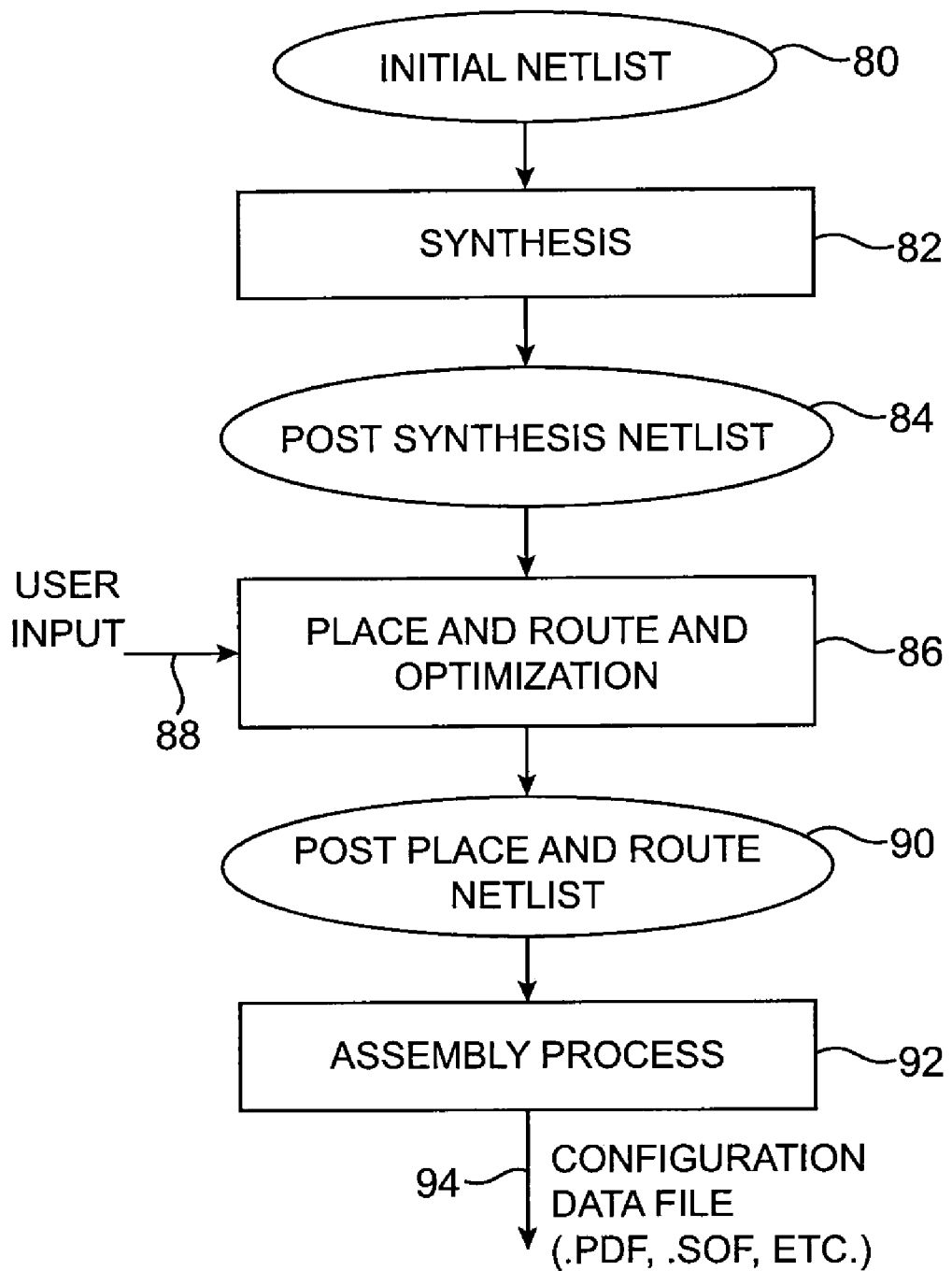
FIG. 5 is a flow chart of illustrative steps involved in designing a custom logic circuit and producing configuration data for that circuit in accordance with the present invention.

Illustrative operations involved in using tools 62 of FIG. 4 to produce configuration data files are shown in FIG. 5. As shown in FIG. 5, an initial netlist 80 is synthesized at step 82 to produce a post-synthesis netlist 84. At step 86, user input 88 and the post synthesis netlist 84 are processed during place and route and optimization operations. During the operations of step 86, the CAD tools 62 take account of SSN effects by identifying I/O pins subject to SSN effects and by selecting I/O driver operating parameters and making placement decisions that reduce SSN effects. The resulting netlist 90 is processed further during an assembly process 92 to produce a configuration data file output 94 (e.g., a .pof or .sof file).

CAD tools 62 can automatically identify I/O pins that are subject to SSN effects. CAD tools 62 generally only have information on the nature of output pins, so CAD tools 62 generally only identify simultaneous switching output (SSO) pins, not simultaneous switching input (SSI) pins. Because simultaneous switching noise involves multiple pins, SSO and SSI pins (and their associated drivers) occur in groups (called SSN groups).

CAD tools 62 can identify SSO pins by examining output-enable connectivity in netlist 84 (FIG. 5). If signals are controlled by a common output enable (OE), they are likely to switch simultaneously and lead to SSN. User input may be used to identify SSI pins. User input may also be used to identify SSO pins and to modify SSO pin identifications made automatically by CAD tools 62.

Figure 6:
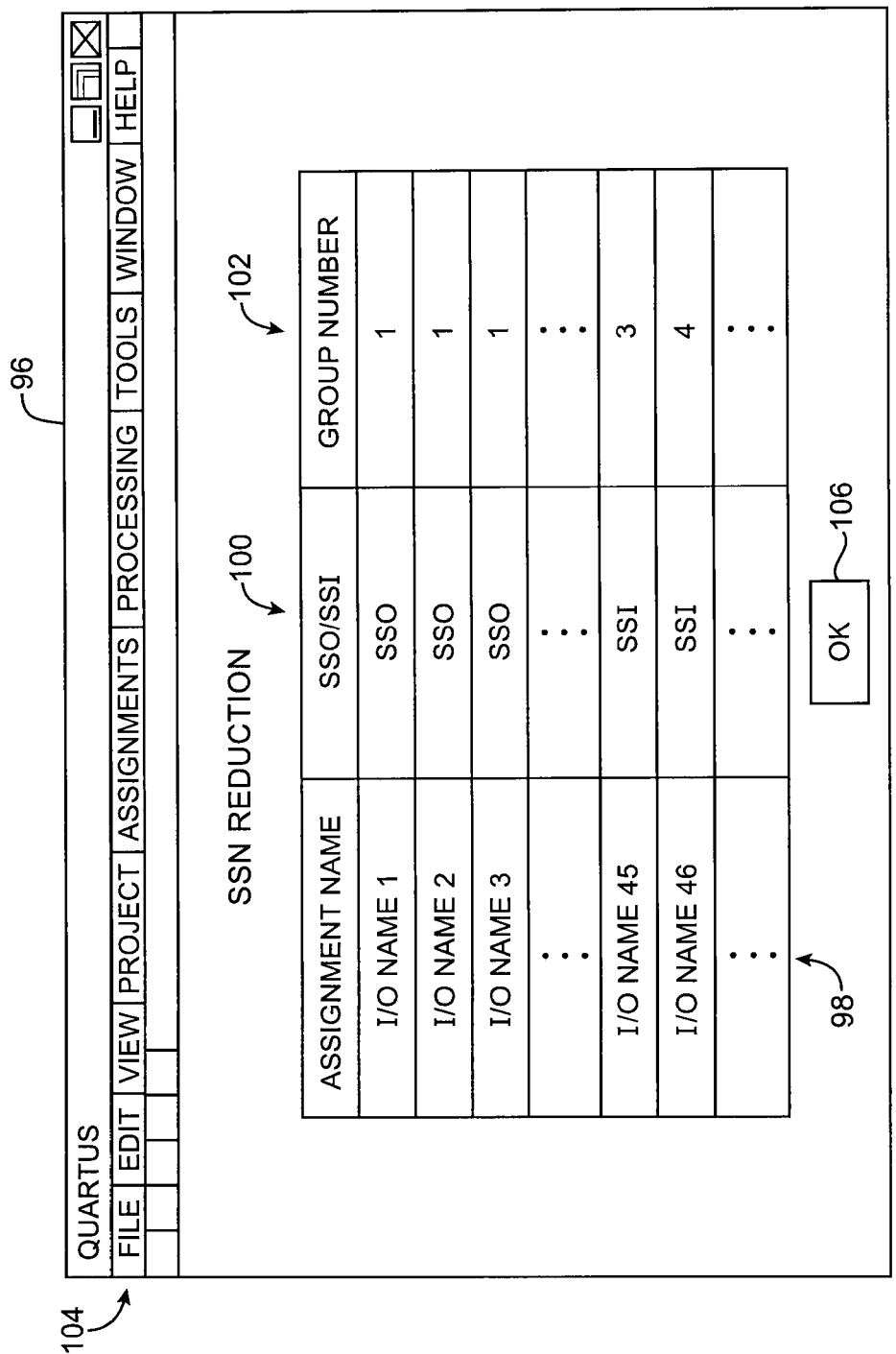
FIG. 6 is an illustrative logic design tool screen that may be used to display information on SSN groups in a given design and that may be used to gather user inputs related to SSN signal pins in accordance with the present invention.

CAD tools 62 may present screens to the logic designer that contain information on automatically-identified SSO groups and that allow the logic designer to assist in identifying SSI and SSO groups. An illustrative screen 96 that may be presented on logic design system 56 for the logic designer is shown in FIG. 6.

In the table of screen 96, the pin names for various I/O pins are listed in column 98. Each row of the table contains an entry in column 100 indicating whether the associated I/O signal is an output signal (SSO) or an input signal (SSI). User-supplied group number information is provided in column 102. In the example of FIG. 6, the logic design system 56 has used output enable information to determine that signals I/O name 1, I/O name 2, and I/O name 3 switch simultaneously and has therefore assigned these signals to the same SSO group (called group 1 in the FIG. 6 example). The shared group number for these SSO signals is shown in the first three rows of column 102.

Signals I/O name 45 and I/O name 46 are inputs, as indicated by the associated SSI designations in column 100. In this example, the logic designer has determined that I/O name 45 and I/O name 46 do not switch simultaneously, so I/O name 45 and I/O name 46 have been assigned unique group numbers. If the logic designer would like the CAD tools 62 to treat the SSI and SSO signals of screen 96 differently, the logic designer can use drop down menus 104, mouse clicks, on-screen buttons such as button 106, and other suitable user input arrangements to direct tools 62 to change the I/O group assignments. Using user input (i.e., input from the logic designer) to supply SSN group identification information assists tools 62 when netlist connectivity is too complex to identify SSO groups automatically.

Tools 62 preferably support automatic detection of SSO groups in situations in which netlist connectivity is not too complex to perform automatic analysis. During automatic detection, tools 62 examine the netlist 84 (FIG. 5) to determine which output signals belong in the same SSO groups. If, for example, tools 62 determine that a set of 40 output drivers are all enabled by a common output enable signal, tools 62 can conclude that these 40 outputs belong to a single SSO group. A table of the type shown in FIG. 6 or other suitable arrangements may be provided to display this information to the logic designer. The logic designer can override the categorization decisions made by the tools 62 by interacting with the displayed information. The logic designer may know, for example, that 30 of the 40 outputs that share a common output enable belong in one SSO group whereas the remaining 10 of the 40 outputs that share the output enable switch independently from these outputs and therefore belong in another SSO group.

After having classified the I/O drivers (and their corresponding I/O pins) in the custom circuit design according to their membership in various SSO and SSI groups, the tools 62 can make I/O driver adjustments to help minimize SSN effects. Programmable logic device input and output drivers generally have a number of adjustable parameters such as drive strength, slew rate, and on-chip termination (OCT) resistance. Tools 62 can selectively adjust the driver settings so that when the circuit design is implemented in a programmable logic device integrated circuit, the drivers have optimum settings to reduce SSN effects.

Figure 7:
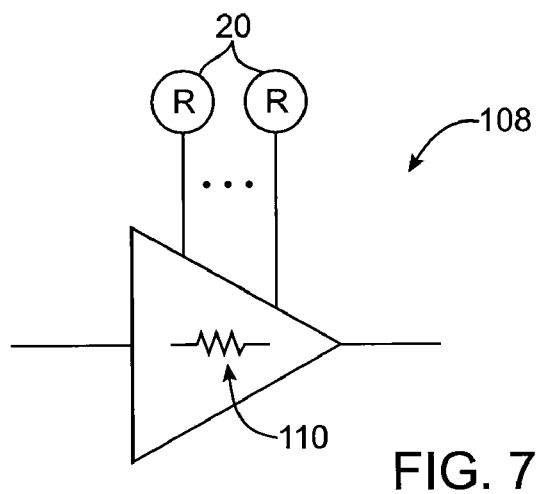
FIG. 7 is a diagram of a programmable driver of the type that may be configured to minimize SSN effects in accordance with the present invention.

An illustrative adjustable programmable logic device I/O driver 108 is shown in FIG. 7. As shown in FIG. 7, driver 108 receives control signals from programmable elements 20. Elements 20 are loaded with configuration data during device programming. After loading, each element 20 supplies a static control signal that controls the operation of driver 108. Driver 108 may be an input or output driver and may handle single-ended or differential signals. Multiple programmable elements 20 are depicted as providing the control signals for adjusting the operation of driver 108 in the example of FIG. 7. In general, any suitable number of control signals may be used.

As shown schematically by resistor 110 in FIG. 7, the OCT resistance associated with driver 108 may be adjusted by signals from elements 20. For example, the OCT resistance value may be set to 25 ohms, 50 ohms, an open circuit, or any other suitable resistance value. In general, on-chip termination (OCT) resistance values are selected to create the correct driver impedances to eliminate stub effects and to prevent reflections on the transmission line. On-chip termination eliminates the need for external termination resistors at the board level while minimizing reflections caused by stubs between the buffer and termination resistor. The correct driver impedance sets the signal voltage swing and can be chosen to strike a balance between high voltage margins and low cross-talk and simultaneous switching output noise. The correct driver impedance also dampens reflections and increases signal integrity.

Another I/O driver parameter that may be adjusted by suitable configuration of programmable elements 20 is drive strength. As an example, the drive strength of driver 108 may be set at 18 mA, 24 mA, or any other suitable value. With one suitable arrangement, the drive strength of driver 108 may be adjusted in 24 increments (e.g., from a strength of 1 to a strength of 24).

If desired, the slew rate of driver 108 may be adjusted. With one suitable arrangement, the hardware of driver 108 may be placed in either a high slew rate mode or a low slew rate mode.

Figure 8:
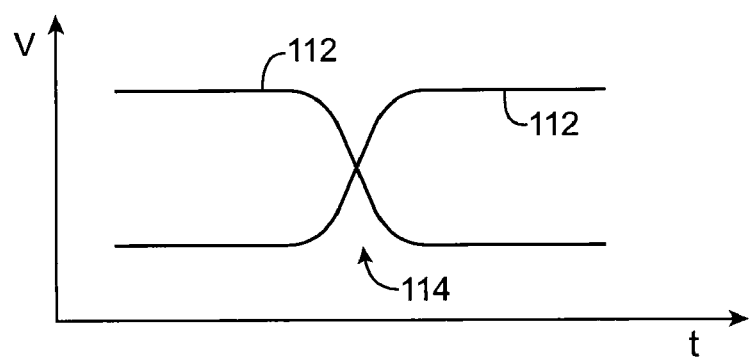
FIG. 8 is a graph showing the output of the driver of FIG. 7 when configured to operate in a high-slew-rate mode in accordance with the present invention.
Figure 9:
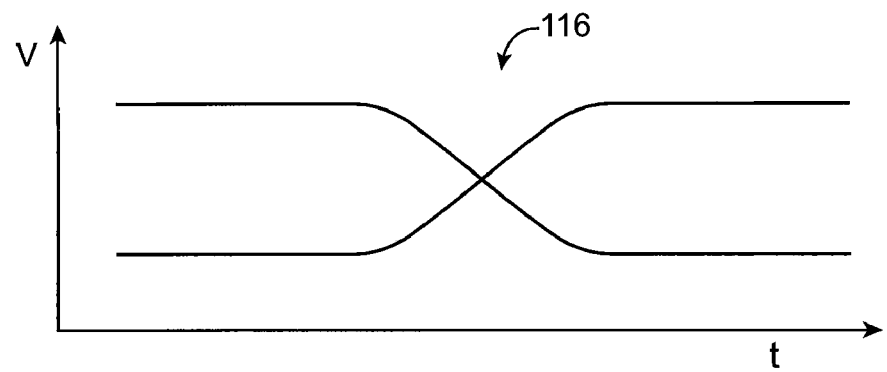
FIG. 9 is a graph showing the output of the driver of FIG. 7 when configured to operate in a low-slew-rate mode in accordance with the present invention.

The driver signal traces 112 in the graph of FIG. 8 illustrates how driver 108 may be adjusted to operate in a high slew rate mode. In this mode, high-low and low-high transitions 114 are rapid. If the control signals applied by programmable elements 20 (FIG. 7) are adjusted, the driver 108 is placed in a low slew rate mode. The signal characteristics of an illustrative driver 108 operating in this mode are shown in FIG. 9. As shown in FIG. 9, the high-low and low-high transitions 116 associated with the driver in the low slew rate mode are slower and less abrupt than the transitions 114 of FIG. 8.

A high slew rate for driver 108 corresponds to a high value of di/dt in equation 1. High slew rates therefore tend to exacerbate problems with SSN. Large drive strengths (current strengths) for driver 108 also result in large values of di/dt. The OCT resistance values affect SSN because high resistance values result in increased voltage swings and therefore greater SSN effects.

CAD tools 62 may allow the logic designer to manually set I/O driver parameters such as drive strength, slew rate, and OCT resistance. The CAD tools 62 may also allow the logic designer to set these values to "auto." When an I/O driver parameter has been set to a particular value, the CAD tools 62 will generally use this value as a fixed design constraint without modification. If, however, a logic designer has set a particular I/O parameter to "auto," the CAD tools 62 will make settings adjustments as needed to reduce the effects of SSN. For example, if CAD tools 62 determines that the total drive current for a particular SSN group would be too high (e.g., N*current setting>threshold), the CAD tools 62 can adjust the drive current value downwards to an acceptable value (e.g., N*current setting=threshold or N*current setting<threshold). The maximum drive current threshold for an SSN group may be a default or user-selected setting.

An illustrative screen 118 that CAD tools 62 may display for a logic designer to provide information on I/O driver settings is shown in FIG. 10. As shown in FIG. 10, information can be provided on each I/O driver name assignment (column 120), driver strength setting (column 122), slew rate setting (column 124), OCT resistance setting (column 126), and register setting (column 126). The logic designer can make adjustments to the settings for I/O drivers in the circuit design using any suitable arrangement. For example, the logic designer can use drop down menus or on-screen buttons, the logic designer can also click (e.g., right-click) on a particular table entry, or may use any other suitable interface in interacting with CAD tools 62 to make a settings adjustment.

In the example of FIG. 10, the driver named OUTSIGNAL_1 has been assigned a driver strength of 23 mA and a high slew rate. The termination resistance value has been set to "off" (open circuit). In certain programmable logic device integrated circuits, output drivers have associated registers that can be switched on or off.

A register may be switched into use when it is desired to register a signal in the I/O circuit 12. If the register in the I/O circuitry is bypassed, the signal will not be registered in the I/O circuitry. Core logic resources (e.g., registers) may be used to register signals that are not registered in the I/O circuitry. In the example of FIG. 10, the output register setting for the OUTSIGNAL_1 driver has been set to "yes," so the OUTSIGNAL_1 register in the I/O circuitry 12 will be active.

Register location can affect simultaneous switching noise, because registers located in the I/O circuitry 12 are synchronized and tend to exacerbate problems with SSN. Whenever possible, SSN effects can be minimized by moving registers to the core.

In the example of FIG. 10, both OUTSIGNAL_2 and OUTSIGNAL_3 have the auto mode enabled for their drive strength setting. This allows CAD tools 62 to adjust the drive strength of these drivers as needed to reduce SSN effects. If, for example, it is determined that the OUTSIGNAL_2 and OUTSIGNAL_3 drivers are part of an SSO group, the output driver strength for these drivers and the other drivers in the group whose output drive strength setting is set to "auto" can be selected so that the total output driver current for the group is not too large. Similarly, because the slew rate for OUTSIGNAL_3 has been set to automatic, the CAD tools 62 will set the slew rate of this driver to a low slew rate value if needed to reduce SSN effects.

Termination resistance and registration settings are handled similarly. If the OCT resistance value is set to auto and the CAD tools 62 determine that SSN effects will be reduced by setting the OCT resistance setting for a given driver to a non-open circuit value (e.g., 25 ohms), the CAD tools 62 can make this adjustment. On-chip termination (OCT) resistance values are preferably selected that strike an appropriate balance between high voltage margins and minimized simultaneous switching output noise. If registration is in "auto" mode for a particular driver and the CAD tools 62 determine that improvements in SSN would be made by moving the register location for that driver from the I/O circuitry 12 to the core logic, the CAD tools 62 will make this change. (With conventional arrangements, OCT resistance settings are generally set to "off" as a default, which can exacerbate SSN effects.) In accordance with the present invention, CAD tools 62 can set OCT resistance settings to 25 ohms, 50 ohms, or other suitable values to reduce signal reflections and simultaneous switching noise.

In making changes to I/O driver operating parameters such as drive strength, slew rate, OCT resistance, and register use, CAD tools 62 check to determine whether timing constraints and other design constraints would be violated by the proposed changes. Changes may be made by the CAD tools 62 to reduce SSN effects provided that design constraints are not violated.

Programmable logic devices often divide their I/O circuitry into regions called I/O blocks and/or banks. Each I/O block contains a different set of input and output drivers. Some programmable logic device architectures have different types of drivers in different locations. Some drivers may be larger than others and may therefore have larger capacitances.

Figure 11:
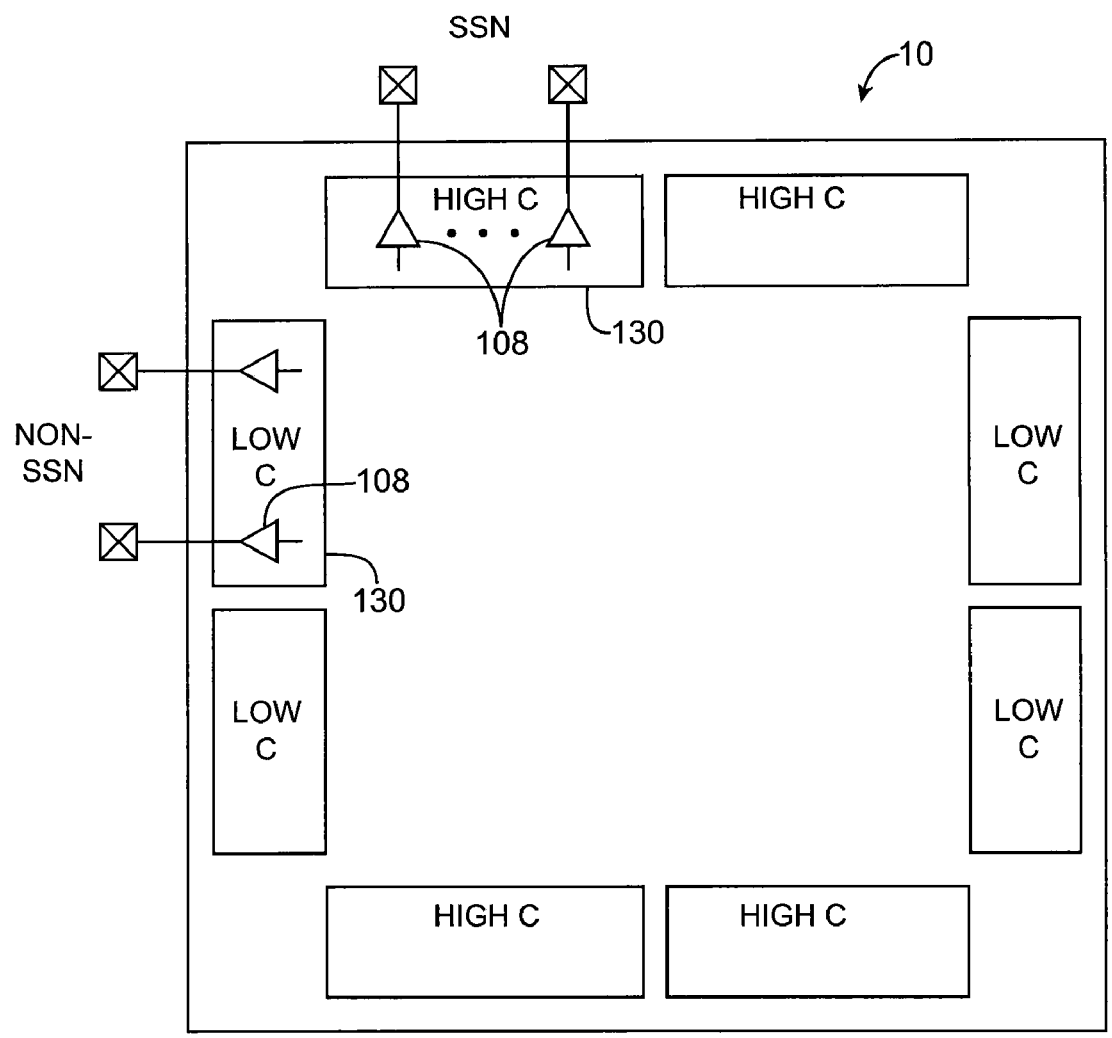
FIG. 11 is a diagram showing how SSN effects can be reduced by locating SSN groups in high capacitance driver locations in accordance with the present invention.

An illustrative programmable logic device in which I/O driver circuitry 12 is provided in the form of a number of I/O blocks 130 is shown in FIG. 11. With this architecture, the largest I/O drivers are located in the high capacitance I/O blocks 130 located at the top and bottom of the device 10 in FIG. 11. Smaller I/O drivers are located in the low capacitance I/O blocks 130 shown on the left and right of device 10 in FIG. 11. The high-C blocks 130 have larger capacitances than the low-C blocks 130. The larger capacitive loads in the high-C blocks tend to reduce output slew. As a result, the CAD tools 62 can minimize SSN effects by placing SSN drivers in the high-C blocks whenever possible. If, for example, a group of 38 output drivers has been identified as being an SSO group, tools 62 can assign this group to 38 high-capacitance pin locations in high-C blocks 130.

Figure 12:
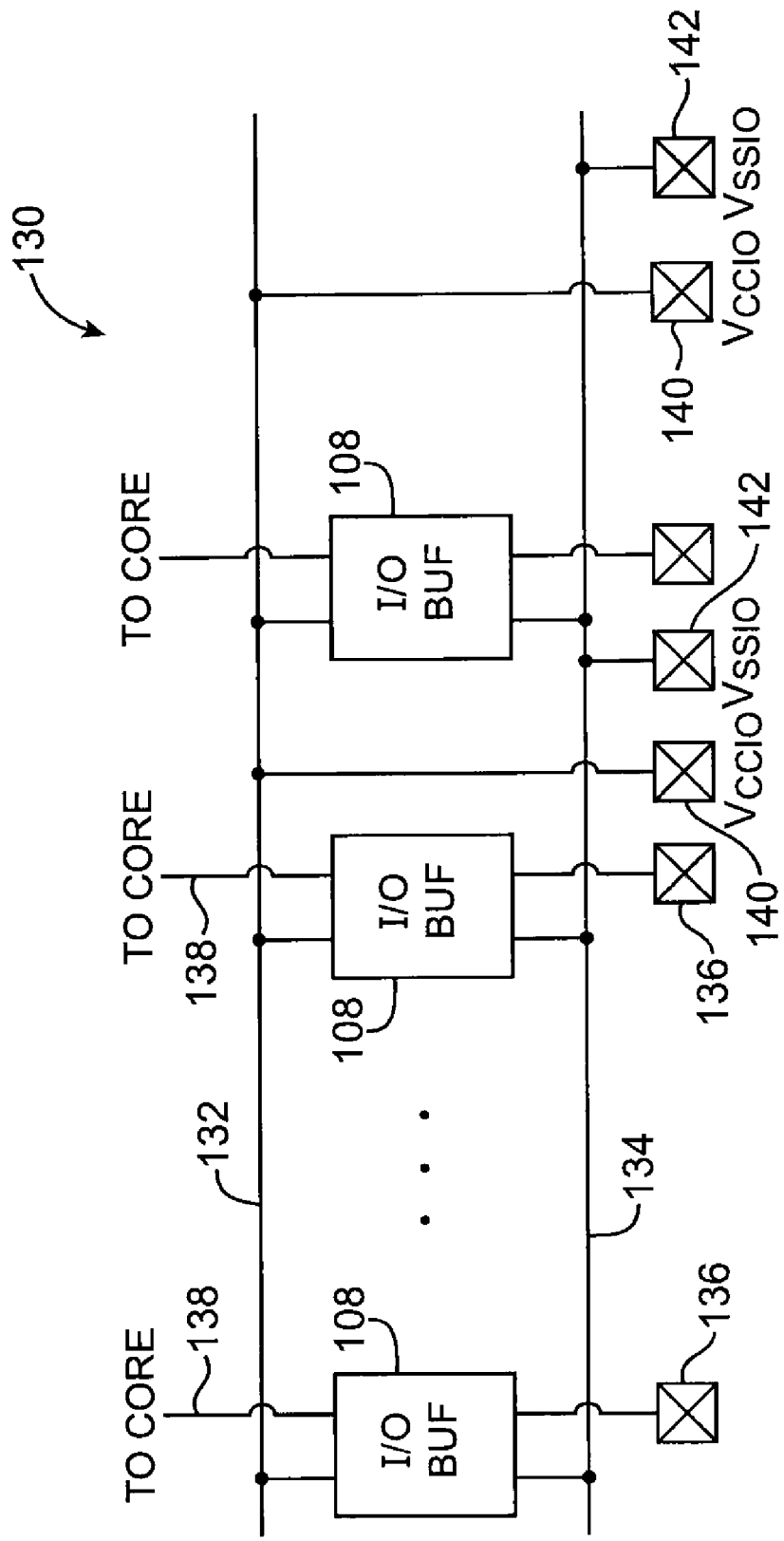
FIG. 12 is a diagram showing how input-output (I/O) buffers are connected to power supply paths that receive power from power supply pins in an I/O bank in accordance with the present invention.

FIG. 12 shows how the I/O buffers 108 in an I/O block 130 on a programmable logic device are powered by a common I/O circuitry ground path 134 (sometimes referred to as the Vssio path) and a common positive I/O circuitry power supply path 132 (sometimes referred to as Vccio path). Vssio path 134 is connected to a source of ground potential via Vssio pins 142. Vccio path 132 is connected to a source of positive power supply voltage via Vccio pins 140.

The I/O power supply voltage used to power the I/O circuitry on the programmable logic device may be larger than the power supply voltages used to power internal circuitry such as circuitry in the core logic. Circuitry in the core logic runs at lower voltages to improve power consumption and efficiency. The I/O blocks in I/O circuitry 12 (FIG. 1) are operated at larger power supply levels to improve noise immunity and to provide sufficient power to drive signals over paths between integrated circuits.

Each I/O buffer 108 has an associated I/O pin 136 for receiving signals or sending signals off chip. Each I/O buffer 108 also has an associated path 138 that is connected to core logic on the programmable logic device. In the example of FIG. 12, the I/O buffers 108 are shown as being single-ended buffers that have a single associated pin 136 and a single associated path 138. If desired, buffers 108 may be differential buffers that use two parallel differential signal paths for path 138 and/or the connections to pins 136.

Figure 13:
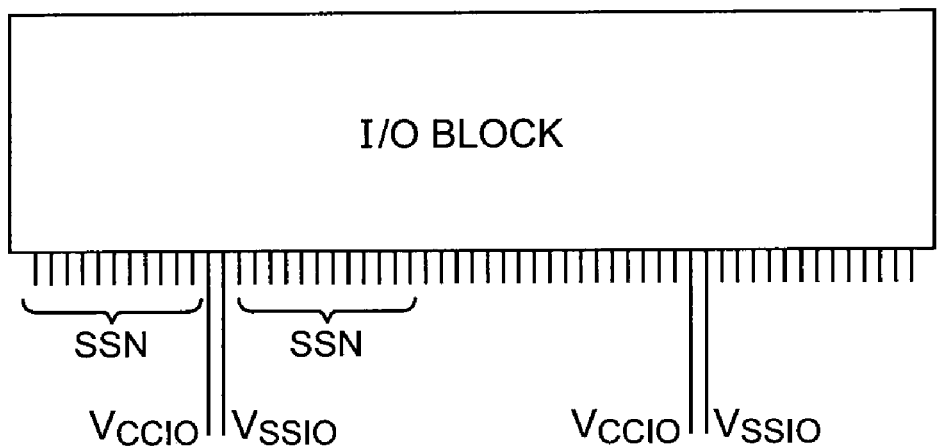
FIG. 13 is a diagram showing how conventional logic design tools often assign SSN groups to I/O locations that are crowded around a single set of power pins.

The location of the I/O buffers 108 within an I/O block 130 can affect the SSN performance of the programmable logic device. In particular, in packaged devices 10 in which SSN groups are located in proximity to the Vccio and Vssio power pin pairs will exhibit lower amounts of SSN than devices 10 in which SSN groups are located far from the power pins. As shown in FIG. 13, conventional placement arrangements often result in SSN groups that are clustered around a single set of power supply pins in an I/O block. When the I/O drivers on a programmable logic device are distributed as shown in the conventional arrangement of FIG. 13, the packaged device can suffer from excessive SSN due to high loop inductances.

Figure 14:
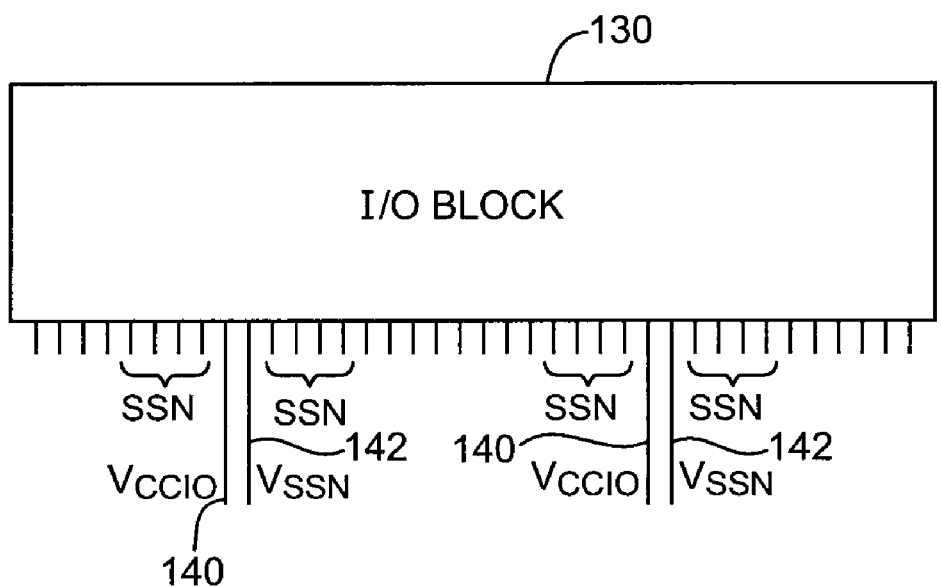
FIG. 14 is a diagram showing how a circuit design tool in accordance with the present invention can reduce SSN effects by moving SSN groups closer to power pins.

In contrast, the CAD tools 62 of the present invention distribute SSN groups closer to the power-pin pairs, as shown in FIG. 14. In the example of FIG. 14, CAD tools 62 have identified 16 SSN I/O drivers. These 16 I/O drivers have been split into four 4-pin groups. There are two pairs of power pins 140/142 in the I/O block 130 of FIG. 14, so each power pin pair receives 8 of the SSN I/O drivers. Four SSN pins are located on the left of each power pin pair and four SSN pins are located on the right of each power pin pair. Because the SSN groups have been moved closer to the power-pin pairs, SSN signals are placed closer to their return paths and large currents need not traverse long distances. The loop inductances associated with the SSN I/Os are reduced, which reduces L in equation 1 and helps to minimize SSN effects.

Another way that CAD tools 62 minimize SSN effects is by restricting the number of SSN pins in a given area. With one suitable arrangement, the logic designer may set a maximum number of SSN pins allowed per I/O block or a default threshold may be used. If a given design involves more SSN pins, the excess pins can be moved to another region of the programmable logic device 10.

Figure 15:
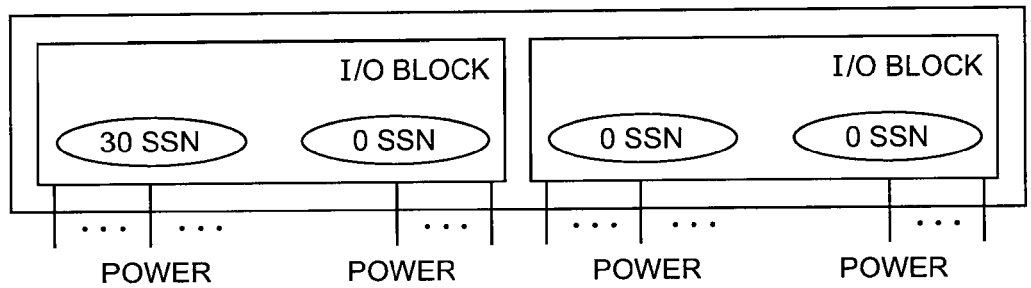
FIG. 15 is a diagram showing how conventional logic design tools often assign SSN groups without restricting the total number of SSN pins in a given location.

Consider the situation in which there are 30 SSN drivers. As shown in the example of FIG. 15, a conventional design systems may place all 30 SSN drivers adjacent to a single pair of power pins in a single I/O block (i.e., the leftmost power pins in the leftmost I/O block in the example of FIG. 15). Because there are so many SSN pins, the I/O to power ratio is unfavorably high, which leads to excessive SSN.

Figure 16:
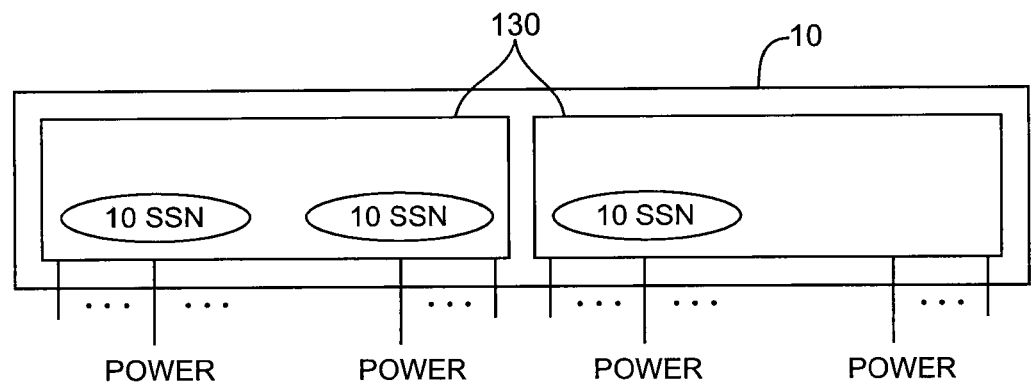
FIG. 16 is a diagram showing how a logic design tool in accordance with the present invention can reduce SSN effects by restricting the number of SSN pins in certain I/O locations.

With the CAD tools 62 of the present invention, the 30 SSN drivers can be distributed across multiple sets of power pins and, if desired, multiple I/O blocks 130, as shown in FIG. 16. This arrangement ensures that there are never more than a threshold number (e.g., 10 in this example) of SSN pins powered by a given set of power supply pins. Maintaining a limit on the number of SSN pins that are powered by the same power supply pins ensures that the value of N in equation 1 does not exceed the threshold number and therefore helps to minimize SSN effects. With one suitable arrangement, CAD tools 62 allow the logic designer to specify a desired limit for the ratio between the number of I/O pins (SSN pins) and power pins. This limit restricts the number of SSN pins so that the I/O to power ratio is never violated by CAD tools 62 during place and route operations.

Figure 17:
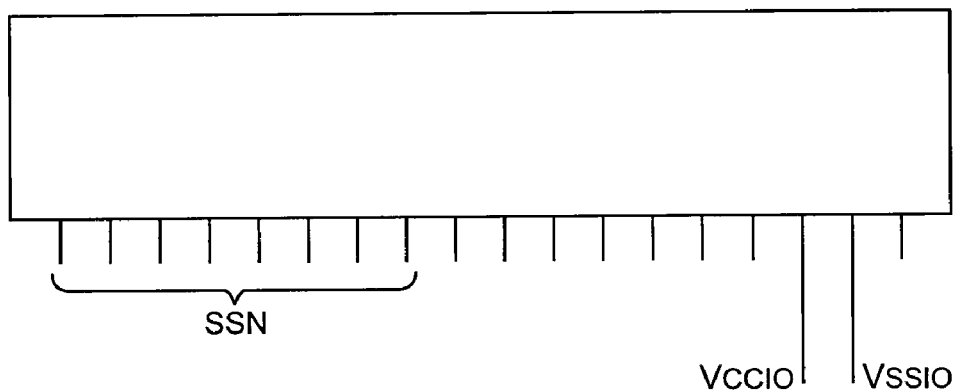
FIG. 17 is a diagram showing how conventional logic design tools often make I/O assignments so that there is an undesirably high I/O to power ratio in accordance with the present invention.

Another way in which CAD tools 62 improve SSN performance is by inserting additional power pins (soft power and ground pins) into the I/O circuitry 12. Many programmable logic device architectures allow I/O pins to be configured as either data pins or power pins by programming the I/O circuitry associated with each pin. In conventional logic design systems, a group of eight SSN pins in an I/O block might be served by a single set of poorly-located power pins, as shown in FIG. 17.

Figure 18:
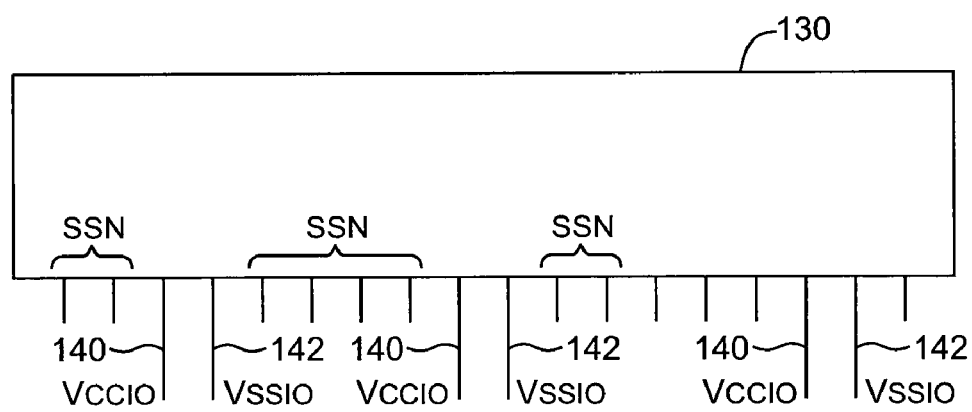
FIG. 18 is a diagram showing how a logic design tool in accordance with the present invention can reduce SSN effects by assigning SSN groups and power pins so that a maximum I/O to power ratio is not exceeded.

With CAD tools 62, the I/O pins in the SSN group have been identified. The CAD tools 62 therefore convert some of the I/O pins in the vicinity of the SSN group from data pins into power pins. This type of arrangement is shown in FIG. 18. In the example of FIG. 18, two sets of power pins 140 and 142 have been inserted among the eight SSN pins. These power pins were created by assigning power pin tasks to pins that would otherwise have been used for data handling tasks. So long as other design constraints are not violated and the CAD tool settings permit auto insertion of power pins, this will help improve performance by improving the I/O to power ratio in the I/O blocks 130. The ability of CAD tools 62 to automatically program ground and Vcc pins to achieve an improved I/O to power ratio helps to reduce SSN effects. In the example of FIG. 18, the Vccio and Vssio pins are located adjacent to each other. This is not necessary. If desired, ground and power pins can be provided individually, in slightly separated pairs, or using any other suitable arrangement.

Figure 19:
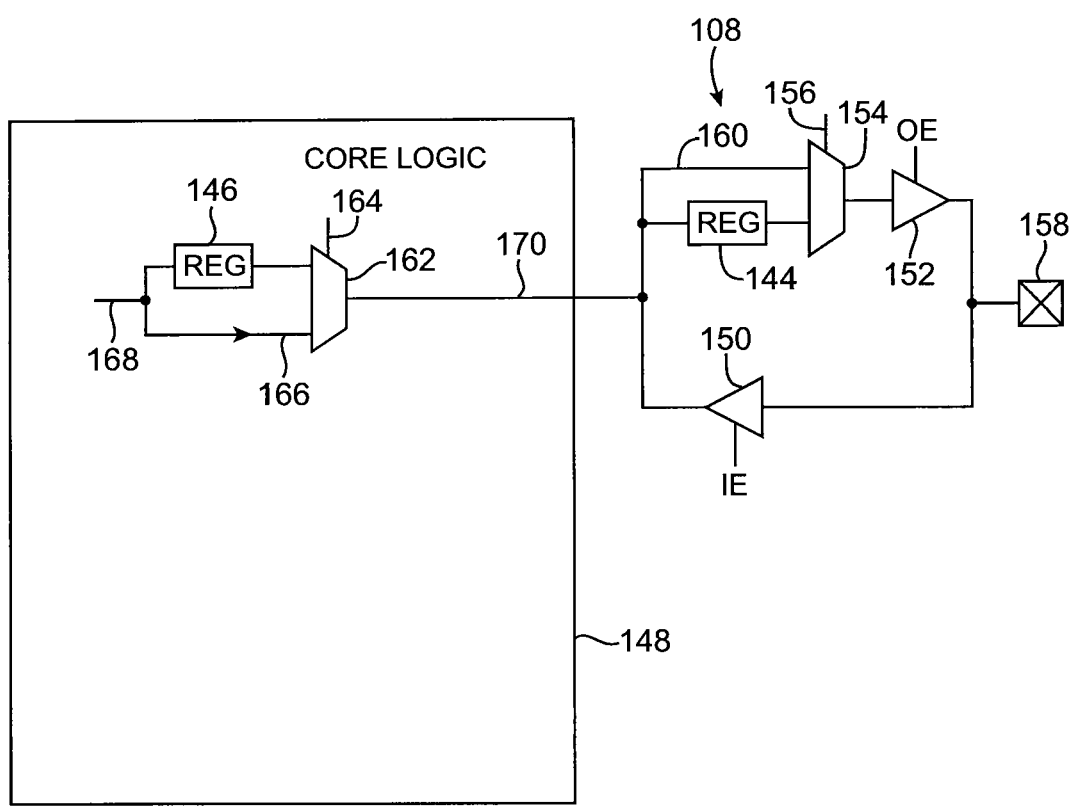
FIG. 19 is a diagram showing how registers can be located in the core logic of a programmable logic device by a logic design tool when minimizing SSN effects in accordance with the present invention.

As shown in FIG. 19, programmable logic device 10 may have hardware capabilities for registering I/O signals. In the example of FIG. 19, I/O buffer 108 has an output register 144 and a register 146 in core logic 148. Core logic 148 is generally located in the center of the chip and operates at a lower power supply voltage than the I/O circuitry 12 of which buffer 108 is a part.

Buffer 108 has an input driver 150 that is controlled by an input enable signal (IE) and an output driver 152 that is controlled by an output enable (OE) signal. As illustrated schematically by multiplexer 154, register 144 can be selectively bypassed. In designs in which it is desired to register the output signal handled by buffer 108 at the output, the control signal applied to terminal 156 from an associated programmable element 20 is used to connect register 144 into the output path. In this situation, signals are registered by register 144 prior to being driven off of the chip via output buffer 152 and pin 158. In designs in which it is not desired to register the output signal with register 144, a different control signal is applied to terminal 156. In this situation, signals are diverted through bypass path 160 to pin 158.

As indicated schematically by multiplexer 162, the register capabilities of core logic 148 can also be selectively bypassed. When it is desired to register signals in the core 148, control signals are applied to multiplexer 162 via control terminal 164 that allow core logic signals on path 168 to pass through register 146 to output path 170. When it is desired to bypass register 146, multiplexer 162 can be configured to pass signals from path 168 to path 170 through bypass path 166.

Registers 144 and 146 can be controlled by clocks or other control signals. For some designs, it is critical that signals be registered using I/O registers in the I/O circuitry 12 such as register 144. In these circumstances, the signals are registered at precisely the same time, as governed by the common clock applied to all of the registers 144. This precise synchronization between output switching signals can lead to SSN problems or can exacerbate existing SSN. The internal registers 146 are not precisely synchronized with the output registers 144. Registers 146 may operate using separate clocks or control signals than registers 144 and there may be uneven path delays along paths such as path 170 of FIG. 19 that tend to reduce the simultaneous nature of the switching outputs. As a result, SSN is relatively lower in situations in which one signal is registered using an I/O register 144 and another signals is registered using a core register 146 than in situations in which both signals are registered using an I/O register 144.

In accordance with the present invention, CAD tools 62 exploit this effect by selectively using registers in core logic 148 in place of I/O registers 144 when possible. If a given design specifies that an output signal in an SSN group is to be registered and there is no constraint forcing the register to be located in the I/O circuitry 12, CAD tools 62 will implement the register in core logic 148 rather than in I/O circuitry 12. This operation can be performed for all SSN groups and tends to minimize SSN by reducing di/dt in equation 1. So long as placement in the core is permitted by the user-defined or default settings in tools 62 and provided that timing constraints and other design constraints are not violated, tools 62 will minimize SSN effects by relocating I/O registers in the core.

Figure 20:
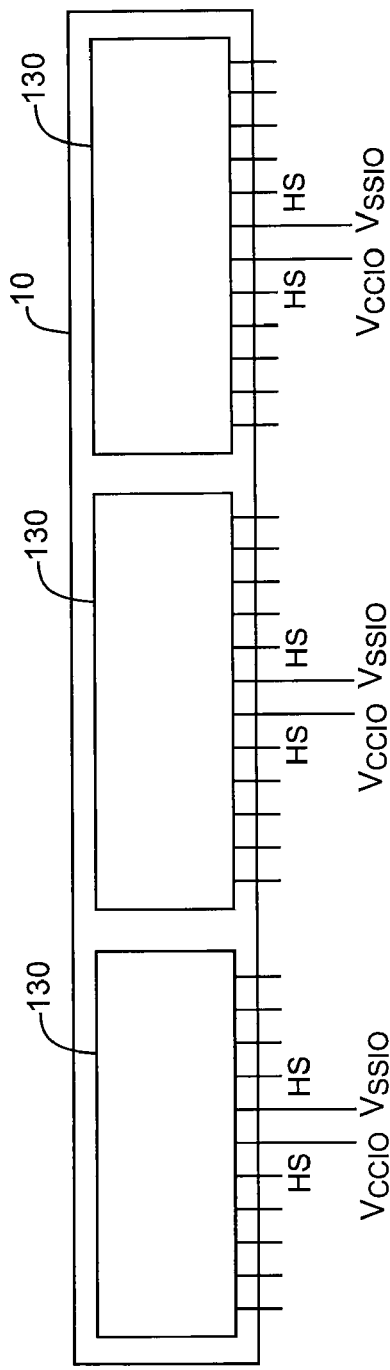
FIG. 20 is a diagram showing how a logic design tool can place high slew I/O pins in the vicinity of power pins to minimize SSN effects in accordance with the present invention.

CAD tools 62 may also minimize SSN effects by minimizing the number of high-slew-rate pins in a given area. For example, if not prohibited by design constraints, CAD tools 62 may distributed high-slew-rate signals HS evenly across a number of power pin locations, as shown in FIG. 20. In the example of FIG. 20, the six high-slew drivers (HS) have been distributed evenly among the three sets of power pins. This separates the HS drivers from each other so that they are not crowded. By minimizing crowding, the term di/dt in equation 1 is reduced. Distributing the HS drivers as shown in FIG. 20 also places the high-slew SSN drivers near to power pins Vccio and Vssio, which reduces the inductance term L in equation 1, as described in connection with FIGS. 13 and 14. In the example of FIG. 20, CAD tools 62 have distributed SSN I/Os among multiple I/O blocks. If desired, high-slew drivers may be separated by placing them at separate locations within the same I/O block 130.

Figure 21:
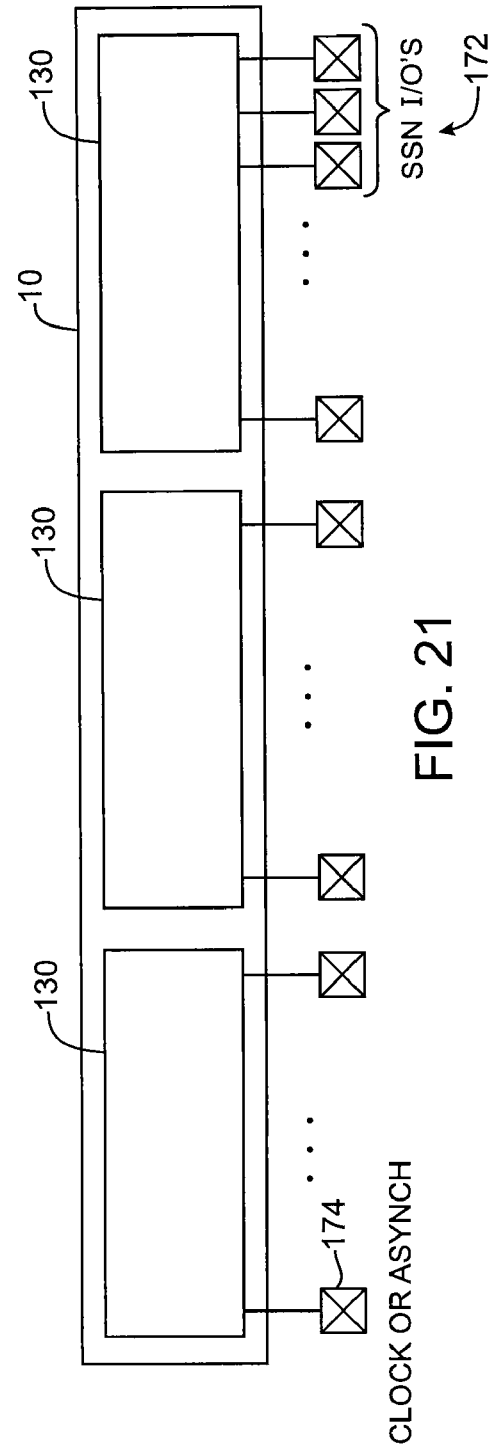
FIG. 21 is a diagram showing how a logic design tool can locate SSN I/Os distant from clock and asynchronous I/O pins to minimize SSN effects in accordance with the present invention.

The effects of SSN can be further minimized by ensuring that SSN groups are not located too close to clock pins and other asynchronous pins such as clears and loads. Moving critical signals away from noisy areas in this way reduces the likelihood of SSN-related problems. This is illustrated in FIG. 21. In the example of FIG. 21, CAD tools 62 have identified a group of SSN I/O drivers 172 in the I/O circuitry of device 10 and have placed these SSN I/Os at a location that is well separated from clock/asynch pin 174. In general, CAD tools 62 may locate SSN groups as far from clock and asynchronous pins as possible to reduce SSN effects, provided that design constraints are not violated. In the example of FIG. 21, CAD tools 62 have moved SSN group 172 to a different I/O block 130 than pin 174. If desired, CAD tools 62 can be configured to move SSN groups to locations that are well separated from pins such as pin 174 without moving these SSN groups to other I/O blocks 130.

An illustrative settings screen 176 that may be presented to a logic designer by CAD tools 62 is shown in FIG. 22. The on-screen options of screen 176 may be used to adjust settings related to minimizing SSN effects. The arrangement of FIG. 22 is merely illustrative. Any suitable arrangement may be used to obtain settings information from the logic designer. Moreover, default settings can be used in place of user-adjustable settings if desired.

In the illustrative arrangement of FIG. 22, option 178 may be used to choose whether or not to allow the CAD tools 62 to automatically process the circuit netlist to identify SSO groups, as described in connection with FIG. 6.

Option 180 may be used to choose whether or not the CAD tools 62 will automatically make appropriate changes to I/O driver parameters to reduce SSN effects.

If option 182 is selected, CAD tools 62 will make permissible adjustments to the strength of programmable SSN drivers to reduce SSN effects.

If option 184 is selected, CAD tools 62 will reduce SSN effects by configuring appropriate SSN drivers so that they have lower slew rates.

If option 186 is selected, CAD tools 62 will reduce SSN effects by automatically selecting OCT resistance values that minimize SSN effects. For example, if the OCT resistance setting of a particular output driver in an SSN group is set to "auto" on a CAD screen such as screen 118 of FIG. 10, CAD tools 62 will set the OCT resistance value for that driver to an appropriate value (e.g., 25 ohms) rather than leaving the OCT resistance at infinity (i.e., as an open circuit). In performing these operations, CAD tools 62 can take into account other constraints (e.g., the desire to maintain high voltage margins to improve signal integrity and the desire to reduce reflections).

Option 188 controls whether the CAD tools will perform automatic placement operations that optimize the design and reduce SSN. If option 188 is not selected, the circuit design will be implemented in a programmable logic device integrated circuit without making placement decisions based on SSN reduction considerations. If option 188 is selected, CAD tools 162 will make intelligent placement decisions to reduce SSN while satisfying design constraints.

Option 190 dictates whether high capacitance locations are to be favored over low capacitance locations. If option 190 is selected, CAD tools 62 can place high-slew-rate SSN drivers in high-C I/O blocks 130 to minimize SSN, as described in connection with FIG. 11.

If option 192 is selected by a logic designer, CAD tools 62 will favor locations near to power pins when placing SSN groups, as described in connection with FIGS. 13 and 14.

If option 194 is selected, CAD tools 62 will limit the number of SSN pins that are allocated to a given set of power pins. As described in connection with FIGS. 15 and 16, this will ensure that the number of I/O drivers associated with each set of power pins is not too great, thereby helping to minimize SSN effects.

Option 196 relates to configuring I/O pins in the I/O circuitry 12 (FIG. 1) as power pins. If option 196 is selected, CAD tools 62 will selectively convert data pins in the I/O circuitry into power pins to maintain a satisfactory ratio between the number of SSN drivers and the number of power pins, as described in connection with FIGS. 17 and 18.

Option 198 relates to how CAD tools 62 implement register logic within the device. If option 198 is selected, CAD tools 62 can selectively move registers for SSN groups from the periphery of the device to the logic core, thereby reducing simultaneous switching and SSN effects, as described in connection with FIG. 19.

If option 200 is selected, the CAD tools 62 can automatically place high slew pins adjacent to power pins, as described in connection with FIG. 20. Placing high slew pins in SSN groups in the proximity of power pins helps to reduce loop inductance and SSN effects.

Option 202 relates to automatic placement of SSI and SSO groups relative to clock pins and other asynchronous pins. If option 202 is selected, CAD tools 62 can automatically minimize SSN effects by ensuring that there is a sufficient separation between the location of clock and asynchronous pins and SSN pins, as described in connection with FIG. 21.

Figure 23:
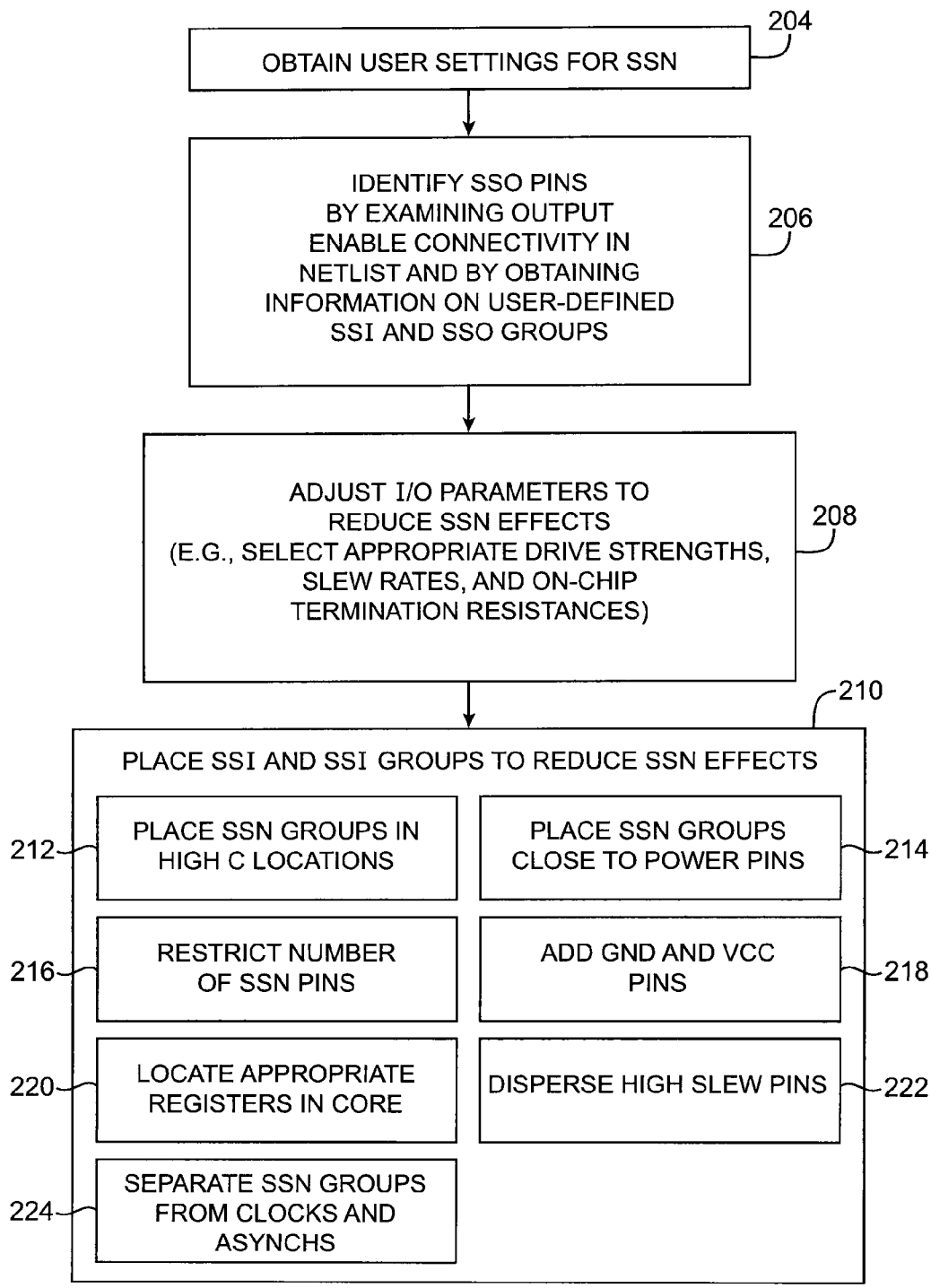
FIG. 23 is a flow chart of illustrative steps involved in using a logic design tool to minimize SSN effects in a circuit design in accordance with the present invention.

Illustrative steps involved in using CAD tools 62 to reduce SSN effects when implementing a custom logic design in a programmable logic device integrated circuit are shown in FIG. 23.

At step 204, CAD tools 62 use a settings screen such as screen 176 and/or other suitable user input arrangements to gather user settings related to minimizing SSN effects when implementing a custom circuit design in a given programmable logic device integrated circuit. If desired, some or all settings may be provided as defaults.

At step 206, the CAD tools 62 use operations of the type described in connection with FIG. 6 to identify SSN pins. A logic designer can manually inform tools 62 how to assign pins to SSN groups, particularly SSI groups and complex SSO groups. SSO groups can also be automatically identified by CAD tools 62 by examining a netlist description of the circuit. When the CAD tools 62 identify certain I/O drivers as being driven by a common output enable, the CAD tools 62 can automatically conclude that these I/O drivers belong in the same SSO group. The logic designer can override this determination if desired.

After the SSN groups have been identified at step 206, the CAD tools 62 can adjust parameters for the drivers in the SSN groups such as drive strengths, slew rates, and OCT resistances to minimize SSN effects at step 208.

At step 210, the CAD tools 62 can minimize SSN effects by making intelligent placement decisions for the drivers in the SSN groups. The SSN drivers can be placed in high capacitance locations (step 212). The SSN drivers can be placed in proximity to power pins (step 214). The number of SSN drivers per power pin can be restricted (step 216). Power pins (e.g., ground pins at 0 volts and soft power pins at Vcc) can be added in the vicinity of the SSN drivers by converting available data pins into power pins (step 218). Registers in the core logic can be used in place of registers in the I/O circuitry (step 220). High-slew-rate drivers can be distributed evenly so as to avoid crowding (step 222). Sufficient spacing may be provided between SSN drivers and clock and other asynchronous pins (step 224).

Following successful place and route operations, CAD tools 62 can generate configuration data files or other suitable output data to finish implementing the custom circuit in programmable logic devices.

The foregoing is merely illustrative of the principles of this invention and various modifications can be made by those skilled in the art without departing from the scope and spirit of the invention.

What is claimed is:

1. A computer-implemented method for using a computer-aided design tool to minimize simultaneous switching noise when implementing a custom circuit design in a programmable logic device integrated circuit, comprising:

using the computer-aided design tool to identify which input-output drivers in the custom circuit design switch simultaneously and belong in a common simultaneous switching noise group; and when performing placement operations to determine where to locate the input-output drivers of the common simultaneous switching noise group within the programmable logic device integrated circuit to implement the custom circuit design, using the computer-aided design tool to automatically make placement decisions for the input-output drivers of the common simultaneous switching noise group to help minimize simultaneous switching noise effects in the programmable logic device integrated circuit.

2. The computer-implemented method defined in claim 1 further comprising using the computer-aided design tool to display a screen that contains selectable user settings associated with optimizing placement of the input-output drivers to minimize simultaneous switching noise.

3. The computer-implemented method defined in claim 1 further comprising using the computer-aided design tool to automatically select operating parameters for at least some of the input-output drivers of the common simultaneous switching noise group to help minimize simultaneous switching noise effects in the programmable logic device integrated circuit.

4. The computer-implemented method defined in claim 1, wherein the input-output drivers of the common simultaneous switching noise group have programmable drive strengths, the method further comprising using the computer-aided design tool to automatically select the programmable drive strengths for at least some of the input-output drivers of the common simultaneous switching noise group to help minimize simultaneous switching noise effects in the programmable logic device integrated circuit.

5. The computer-implemented method defined in claim 1, wherein the input-output drivers of the common simultaneous switching noise group have programmable slew rates, the method further comprising using the computer-aided design tool to automatically select programmable slew rates for at least some of the input-output drivers of the common simultaneous switching noise group to help minimize simultaneous switching noise effects in the programmable logic device integrated circuit.

6. The computer-implemented method defined in claim 1 wherein the input-output drivers of the common simultaneous switching noise group have programmable on-chip termination resistances, the method further comprising using the computer-aided design tool to automatically select the programmable on-chip termination resistances for at least some of the input-output drivers of the common simultaneous switching noise group to help minimize simultaneous switching noise effects in the programmable logic device integrated circuit.

7. The computer-implemented method defined in claim 1, wherein the input-output drivers of the common simultaneous switching noise group have programmable drive strengths, programmable slew rates, and programmable on-chip termination resistances, the method further comprising using the computer-aided design tool to automatically select the programmable drive strengths, the programmable slew rates, and the programmable on-chip termination resistances for at least some of the input-output drivers of the common simultaneous switching noise group to help minimize simultaneous switching noise effects in the programmable logic device integrated circuit.

8. The computer-implemented method defined in claim 1 wherein using the computer-aided design tool to automatically make placement decisions for the input-output drivers of the common simultaneous switching noise group to help minimize simultaneous switching noise effects in the programmable logic device integrated circuit comprises:

placing at least some of the input-output drivers of the common simultaneous switching noise group in high-capacitance input-output circuitry blocks on the programmable logic device integrated circuit to minimize simultaneous switching noise.

9. The computer-implemented method defined in claim 1 wherein using the computer-aided design tool to automatically make placement decisions for the input-output drivers of the common simultaneous switching noise group to help minimize simultaneous switching noise effects in the programmable logic device integrated circuit comprises:

placing at least some of the input-output drivers of the common simultaneous switching noise group adjacent to power pins on the programmable logic device integrated circuit to minimize simultaneous switching noise.

10. The computer-implemented method defined in claim 1 wherein using the computer-aided design tool to automatically make placement decisions for the input-output drivers of the common simultaneous switching noise group to help minimize simultaneous switching noise effects in the programmable logic device integrated circuit comprises:

restricting how many of the input-output drivers of the common simultaneous switching noise group are located adjacent to a given set of power pins in a given input-output circuitry block on the programmable logic device integrated circuit to minimize simultaneous switching noise.

11. The computer-implemented method defined in claim 1 wherein using the computer-aided design tool to automatically make placement decisions for the input-output drivers of the common simultaneous switching noise group to help minimize simultaneous switching noise effects in the programmable logic device integrated circuit comprises:
    inserting power pins among the input-output drivers of the common simultaneous switching noise group in an input-output circuitry block on the programmable logic device integrated circuit to minimize simultaneous switching noise.

12. The computer-implemented method defined in claim 1 wherein at least some of the input-output drivers of the common simultaneous switching noise group comprise output drivers and wherein using the computer-aided design tool to automatically make placement decisions for the input-output drivers of the common simultaneous switching noise group to help minimize simultaneous switching noise effects in the programmable logic device integrated circuit comprises:
    locating registers associated with at least some of the output drivers of the common simultaneous switching noise group in core logic rather than input-output circuitry on the programmable logic device integrated circuit to minimize simultaneous switching noise.

13. The computer-implemented method defined in claim 1 wherein using the computer-aided design tool to automatically make placement decisions for the input-output drivers of the common simultaneous switching noise group to help minimize simultaneous switching noise effects in the programmable logic device integrated circuit comprises:
    dispersing high-slew rate input-output drivers in the common simultaneous switching noise group to minimize simultaneous switching noise effects by avoiding crowding of the high-slew rate input-output drivers in an input-output circuitry block on the programmable logic device integrated circuit.

14. The computer-implemented method defined in claim 1 wherein using the computer-aided design tool to automatically make placement decisions for the input-output drivers of the common simultaneous switching noise group to help minimize simultaneous switching noise effects in the programmable logic device integrated circuit comprises:
    separating at least some of the input-output drivers of the common simultaneous switching noise group from clock and asynchronous pins in input-output circuitry on the programmable logic device integrated circuit to minimize simultaneous switching noise.

15. The computer-implemented method defined in claim 1 wherein using the computer-aided design tool to identify which input-output drivers in the custom circuit design switch simultaneously and belong in a common simultaneous switching noise group comprises using the computer-aided design tool to examine a netlist for the custom circuit design to determine which input-output drivers share a common output enable.

16. The computer-implemented method defined in claim 1 further comprising using the computer-aided design tool to generate configuration data that programs the programmable logic device integrated circuit to implement the custom circuit design when the configuration data is loaded into the programmable logic device integrated circuit.

17. A computer-implemented method for using a computer-aided design tool to minimize simultaneous switching noise when implementing a custom circuit design in a programmable logic device integrated circuit, comprising:
    using the computer-aided design tool to identify which input-output drivers in the circuit design switch simultaneously and belong in a common simultaneous switching noise group; and
    adjusting at least one programmable operating parameter associated with the input-output drivers of the common simultaneous switching noise group to help minimize simultaneous switching noise effects in the programmable logic device integrated circuit, wherein the programmable operating parameter is selected from a group consisting of: programmable drive strength, programmable slew rate, and programmable on-chip termination resistance.

18. The computer-implemented method defined in claim 17 further comprising:
    when performing placement operations to determine where to locate the input-output drivers of the common simultaneous switching noise group within the programmable logic device integrated circuit to implement the custom circuit design, using the computer-aided design tool to automatically make placement decisions for the input-output drivers of the common simultaneous switching noise group to help minimize simultaneous switching noise effects in the programmable logic device integrated circuit.

19. Software on a computer-readable storage media to be implemented on a computer-aided design tool to minimize simultaneous switching noise when implementing a custom circuit design in a programmable logic device integrated circuit, comprising::
    code for classifying input-output drivers in a custom circuit design for a programmable logic device integrated circuit as belonging to certain simultaneous switching noise groups by examining which input-output drivers are controlled by common output enables; and
    code for adjusting programmable operating parameters associated with at least some input-output drivers of one common simultaneous switching noise group to help minimize simultaneous switching noise effects in the programmable logic device integrated circuit.

20. The software defined in claim 19 further comprising code for performing placement operations to determine where to locate the input-output drivers of the common simultaneous switching noise group within the programmable logic device integrated circuit to implement the custom circuit design, wherein the code for performing placement operations comprises code for making placement decisions for the input-output drivers of the common simultaneous switching noise group to help minimize simultaneous switching noise effects in the programmable logic device integrated circuit.

\* \* \* \* \*